US012564005B2

(12) United States Patent
Do

(10) Patent No.: US 12,564,005 B2
(45) Date of Patent: Feb. 24, 2026

(54) ULTRA-THIN TRANSFER FILM OF ULTRA-THIN LED ELEMENT FOR MANUFACTURING ULTRA-THIN LED ELECTRODE ASSEMBLY USING LASER-ASSISTED MULTI-CHIP TRANSFER PRINTING, ULTRA-THIN LED ELECTRODE ASSEMBLY, AND MANUFACTURING METHOD THEREOF

(71) Applicant: Kookmin University Industry Academy Cooperation Foundation, Seoul (KR)

(72) Inventor: Young Rag Do, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 671 days.

(21) Appl. No.: 17/971,355

(22) Filed: Oct. 21, 2022

(65) Prior Publication Data
US 2023/0132210 A1     Apr. 27, 2023

(30) Foreign Application Priority Data
Oct. 22, 2021     (KR) ........................ 10-2021-0141626

(51) Int. Cl.
| | |
|---|---|
| *H01L 21/683* | (2006.01) |
| *H01L 25/075* | (2006.01) |
| *H10H 20/84* | (2025.01) |
| *H10H 20/01* | (2025.01) |
| *H10H 20/819* | (2025.01) |

(52) U.S. Cl.
CPC ...... *H01L 21/6835* (2013.01); *H01L 25/0753* (2013.01); *H10H 20/84* (2025.01); (Continued)

(58) Field of Classification Search
CPC ............. H01L 21/6835; H01L 25/0753; H01L 2221/68381; H01L 2221/68363; (Continued)

(56) References Cited

U.S. PATENT DOCUMENTS

| | | | | |
|---|---|---|---|---|
| 7,943,440 B2 * | 5/2011 | Kim | ........................ | H10D 86/40 438/149 |
| 8,980,673 B2 * | 3/2015 | Lee | ........................ | H10F 77/169 438/114 |

(Continued)

FOREIGN PATENT DOCUMENTS

| | | |
|---|---|---|
| JP | 2005-174979 | 6/2005 |
| KR | 2012-0122159 | 11/2012 |

(Continued)

OTHER PUBLICATIONS

Office Action dated Sep. 12, 2023 of the corresponding Korean Patent Application No. 10-2021-0141626.

*Primary Examiner* — Vu A Vu
(74) *Attorney, Agent, or Firm* — Haynes Boone, LLP

(57) ABSTRACT

The present invention relates to an ultra-thin light-emitting diode (LED) electrode assembly, a manufacturing method of the ultra-thin LED electrode assembly, and a transfer film of an ultra-thin LED used for manufacturing the ultra-thin LED electrode assembly and relates to an ultra-thin LED electrode assembly in which a plurality of LED elements are simultaneously transferred using a laser-assisted multi-chip transfer printing method to form and pattern the LED elements, thereby preventing process defects caused by omission of the LED elements during transfer and deviation thereof from an electrode line, and defects such as dark spots caused in an LED display, a manufacturing method of the ultra-thin LED electrode assembly, and a transfer film of an ultra-thin LED used for manufacturing the ultra-thin LED electrode assembly.

28 Claims, 17 Drawing Sheets

(52) U.S. Cl.
CPC .. *H01L 2221/68381* (2013.01); *H10H 20/018*
(2025.01); *H10H 20/819* (2025.01)

(58) Field of Classification Search
CPC .......... H01L 2221/68368; H10H 20/84; H10H
20/018; H10H 20/819; H10H 20/0364;
H10H 20/857; H10H 20/01; H10H
20/013; H10H 20/831
USPC .......................................................... 257/88
See application file for complete search history.

(56) References Cited

U.S. PATENT DOCUMENTS

| | | | | |
|---|---|---|---|---|
| 9,893,041 | B2 * | 2/2018 | Pokhriyal | H10H 20/832 |
| 10,068,888 | B2 * | 9/2018 | Zhang | H10H 20/018 |
| 10,685,945 | B2 * | 6/2020 | Robin | H01L 25/0753 |
| 10,770,620 | B2 * | 9/2020 | Chen | H10H 20/0137 |
| 10,886,257 | B2 * | 1/2021 | Hong | H01L 25/0753 |
| 10,937,768 | B2 * | 3/2021 | Takeya | H01L 25/0753 |
| 2019/0103274 | A1 * | 4/2019 | Chang | H01L 21/263 |
| 2020/0043901 | A1 * | 2/2020 | Ahmed | H10H 20/833 |
| 2022/0367750 | A1 * | 11/2022 | Yu | H10F 71/127 |
| 2023/0051769 | A1 * | 2/2023 | Deng | H10H 20/01 |
| 2023/0238476 | A1 * | 7/2023 | Iyer | H10H 20/018 |
| | | | | 257/91 |

FOREIGN PATENT DOCUMENTS

| | | |
|---|---|---|
| KR | 2012-0122645 | 11/2012 |
| KR | 2015-006798 | 1/2015 |
| KR | 2015-0074321 | 7/2015 |
| KR | 2020-0039605 | 4/2020 |

* cited by examiner

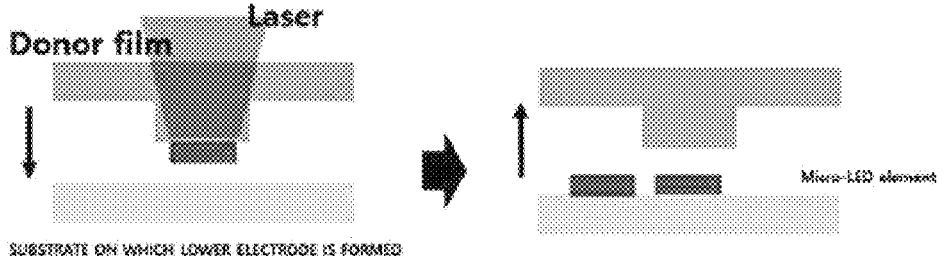
FIG. 1A-A
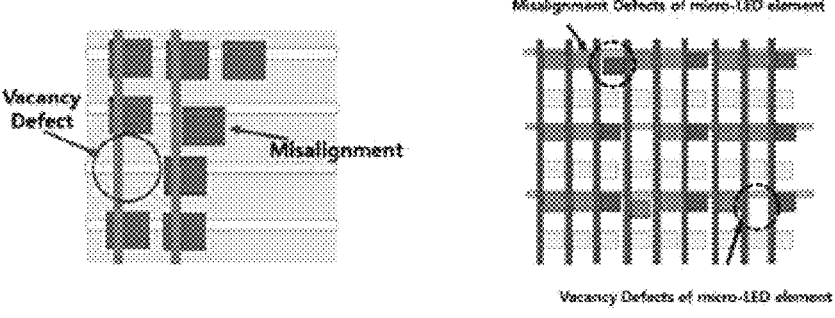
FIG. 1A-B

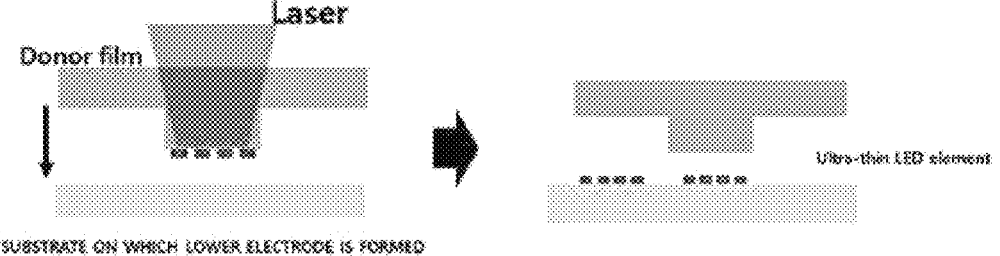
FIG. 1B-A
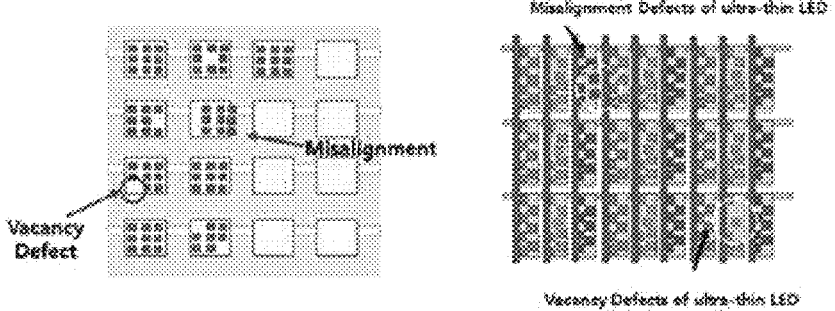
FIG. 1B-B

X-X'

Y-Y'

102

103

1001

100          500          101

301
600
400

211     212     213     214

200

X-X'

X-X'

Y-Y'

ULTRA-THIN TRANSFER FILM OF ULTRA-THIN LED ELEMENT FOR MANUFACTURING ULTRA-THIN LED ELECTRODE ASSEMBLY USING LASER-ASSISTED MULTI-CHIP TRANSFER PRINTING, ULTRA-THIN LED ELECTRODE ASSEMBLY, AND MANUFACTURING METHOD THEREOF

CROSS-REFERENCE TO RELATED APPLICATION

This application claims priority to and the benefit of Korean Patent Application No. 2021-0141626, filed on Oct. 22, 2021, the disclosure of which is incorporated herein by reference in its entirety.

BACKGROUND

1. Field of the Invention

The present invention relates to an ultra-thin light-emitting diode (LED) electrode assembly manufactured by simultaneously transferring, forming, and patterning a plurality of LED elements using a laser-assisted multi-chip transfer printing method, a manufacturing method of the ultra-thin LED electrode assembly thereof, and a transfer film of an ultra-thin LED element used for manufacturing the ultra-thin LED electrode assembly.

2. Discussion of Related Art

There are a wide variety of types of LEDs that have been developed so far. In particular, among various LEDs, micro-LEDs and nano-LEDs are able to implement excellent color and high efficiency and are eco-friendly materials and thus are used as core materials for various light sources and displays. According to such market conditions, recently, research on developing a new nanorod LED structure or a nanocable LED with a shell coated through a new manufacturing process has been underway.

In line with such research in the field of materials, display televisions (TVs) using red, green, and blue micro-LEDs have recently been commercialized. Displays and various light sources using micro-LEDs have advantages such as high performance characteristics, a very long theoretical lifetime, and very high theoretical efficiency. However, since micro-LEDs should be individually disposed on a miniaturized electrode having a limited area, due to a limitation in process technology in consideration of high unit costs, a high process defect rate, and low productivity, an electrode assembly implemented by arranging micro-LEDs on an electrode with pick and place technology is difficult to manufacture into true high-resolution commercial displays from smartphones to TVs or light sources having various sizes, shapes, and brightness. In addition, it is more difficult to individually arrange nano-LEDs, which are implemented to be smaller than micro-LEDs, on an electrode with pick and place technology as in micro-LEDs.

In order to overcome such difficulties, Korean Patent Publication No. 10-1490758 by the present inventor discloses an ultra-small LED electrode assembly manufactured through a method of dropping a solution in which nanorod-type LEDs are mixed on electrodes and then forming an electric field between two different electrodes to self-align nanorod-type LED elements on the electrodes. However, in such disclosed technology, since the LED elements are aligned through an electric field, the LED elements should have a rod shape with a large aspect ratio, which is formed to be elongated in one direction. Since such a rod-type LED element having a large aspect ratio is easily precipitated in a solvent, it is difficult to make the LED element into an ink, and thus it is not easy to implement a large-area electrode assembly through inkjet printing.

In addition, since elements lie down to be assembled on two different electrodes, that is, since the elements are assembled with a stacking direction of each semiconductor layer in the element parallel to a main surface of the electrode, an area from which light is extracted is small, resulting in a problem of lower efficiency. Specifically, a method of manufacturing a nanorod-type LED element using an LED wafer through a top-down method in which a nano-patterning process and dry etching/wet etching are mixed, or growing a nanorod-type LED element directly on a substrate (base substrate) through a bottom-up method is known. In such nanorod-type LEDs, since a major axis of the LED matches a stacking direction, that is, in a stacking direction of each layer in a p-GaN/InGaN multi-quantum well (MQW)/n-GaN, and a p-GaN/InGaN multi-quantum well (MQW)/n-GaN/InGaN stack structure, a light emitting area is narrow, surface defects have a relatively large influence on a decrease in efficiency. Since it is difficult to optimize a recombination rate of electrons and holes, there is a problem in that luminous efficiency is considerably lower than the original efficiency of a wafer.

Furthermore, since two different electrodes formed to allow a nanorod-type LED element to emit light should be formed to be coplanar, there is a problem in that electrode design is not easy.

As another method used for manufacturing an electrode assembly applied to micro-LED displays, there is an attempt to apply a laser-assisted transfer printing method. When laser-assisted transfer printing is performed using existing micro-LED elements, since the micro-LED elements are transferred and printed to a subpixel in a one to one correspondence, due to vacancies of the LED elements caused when only one micro-LED is not actually transferred, or misalignment caused when the micro-LED is transferred beyond an original position, when an electrode is connected to a micro-LED electrode assembly, there is a problem in that light is not emitted, which causes dark spots on a display (see FIGS. 1A and 1B). In particular, when a display having high resolution is manufactured, such a problem caused when laser-assisted transfer printing is performed using existing micro-LED elements causes an increase in a defect rate and a decrease in production yield to cause a decrease in productivity, thereby resulting in a limitation in commercialization.

Recently, a demand for high-resolution displays is increasing, and in particular, a display with very high resolution should be used for high-resolution devices of 8 K or higher, but there is a limitation in manufacturing an LED electrode assembly applied to a high-resolution display using existing micro-LED elements.

RELATED ART DOCUMENTS

Patent Documents

Korean Patent Publication No. 10-1490758 (published on Mar. 26, 2019)

SUMMARY OF THE INVENTION

The inventor of the present invention has developed a new ultra-thin light-emitting diode (LED) electrode assembly in which problems of low resolving power of a display manufactured using micro-LEDs, and display defects due to vacancies of LED elements in a pixel, misalignment errors thereof, and the like are solved. The present invention is directed to providing a manufacturing method of such an ultra-thin LED electrode assembly and a transfer film of an ultra-thin LED for manufacturing the ultra-thin LED electrode assembly.

According to an aspect of the present invention, there is provided an ultra-thin LED electrode assembly including a plurality of lower electrodes formed on a substrate, a plurality of pixel units formed on the lower electrodes, an insulating layer formed on the substrate and the plurality of pixel units, and a plurality of upper electrodes formed on the insulating layer, wherein each of the plurality of pixel units includes subpixel units each including a plurality of ultra-thin LED elements.

The substrate may be a flexible substrate (or a flexible base substrate).

The subpixel unit may include the plurality of ultra-thin LED elements formed using a transfer film of an ultra-thin LED.

The subpixel unit may be formed by transferring the ultra-thin LED elements of the transfer film of the ultra-thin LED using a laser-assisted multi-chip transfer printing method.

The subpixel unit may include three or more ultra-thin LED elements, and the ultra-thin LED element may include at least one selected from among an ultra-thin blue LED element, an ultra-thin green LED element, and an ultra-thin red LED element.

Each of the plurality of pixel units may include three or four subpixel units, and each of the three or four subpixel units may include three or more ultra-thin LED elements.

Each of the three or four subpixel units may have a rectangular shape or a square shape.

Each of the three or four subpixel units may have an aspect ratio of 1:2.0 to 1:4.0.

Each of the plurality of pixel units may include three subpixel units, and the three subpixel units may include a first subpixel unit including an ultra-thin blue LED element, a second subpixel unit including an ultra-thin green LED element, and a third subpixel unit including an ultra-thin red LED element.

All of the three or four subpixel units may include the ultra-thin blue LED element.

When all of the three or four subpixel units include the ultra-thin blue LED element, at least one color conversion layer selected from a green color conversion layer and a red color conversion layer may be further stacked on the upper electrode.

At least one pass filter selected from a short wavelength pass filter (SWPF) and a long wavelength pass filter (LWPF) may be further formed between the upper electrode and the color conversion layer.

The lower electrode may have a line shape, and the upper electrode may have a line shape.

Each of the plurality of ultra-thin LED elements constituting the subpixel unit of a high-resolution ultra-thin LED display of the present invention may include a first conductive semiconductor layer, a photoactive layer, and a second conductive semiconductor layer which are stacked.

The ultra-thin LED elements may be erected and disposed in the subpixel unit such that the first conductive semiconductor layer of the ultra-thin LED element faces the lower electrode.

A cross-sectional shape of the ultra-thin LED element may include at least one shape selected from among a circular shape, an oval shape, and a polygonal shape (a triangular shape, a square shape, a pentagonal shape, a hexagonal shape, an octagonal shape, a decagonal shape, a trapezoidal shape, a rhombic shape, or a star shape), and the plurality of ultra-thin LED elements may be provided as elements having the same cross-sectional shape or may be provided by mixing elements having different cross-sectional shapes.

The ultra-thin LED element includes at least one selected from a disc or dot LED element which has a thickness of 3,000 nm or less in a stacking direction of layers, wherein the dot LED element has a ratio between the thickness and a length of a major axis in a cross section perpendicular to the stacking direction in a range of 1:0.5 to 1:1.5, and the disc LED element has a ratio between the thickness and a length of a major axis in a cross section perpendicular to the stacking direction in a range of 1:1.5 to 1:5.0, and a micro-nanofin LED element which has a thickness of 100 nm to 3,000 nm in a stacking direction of layers and in which a length of a major axis in a cross section perpendicular to the stacking direction is in a range of 100 nm to 10,000 nm, and a ratio between the thickness and the length of the major axis is 1:3 or more.

The LED electrode assembly may include a lower electrode line including one or more lower electrodes, the plurality of ultra-thin LED elements erected and arranged on the lower electrodes in a stacking direction of layers, and an upper electrode line including one or more upper electrodes disposed on the plurality of ultra-thin LED elements.

The ultra-thin LED element may have a maximum surface area of $\frac{1}{3}$ or less of a subpixel area.

The first conductive semiconductor layer of the ultra-thin LED element may be an n-type III-nitride semiconductor layer, and the ultra-thin LED element may further include an electron delay layer on an opposite surface opposite to one surface of the first conductive semiconductor layer adjacent to the photoactive layer such that the numbers of electrons and holes recombined in the photoactive layer are balanced.

The electron delay layer may be a III-nitride semiconductor having a lower doping concentration than the first conductive semiconductor layer.

The second conductive semiconductor layer of the ultra-thin LED element may be a p-type III-nitride semiconductor layer, and the ultra-thin LED element may further include an electron delay layer on an opposite surface opposite to one surface of the second conductive semiconductor layer adjacent to the photoactive layer such that the numbers of electrons and holes recombined in the photoactive layer are balanced.

The an electron delay layer may include at least one selected from among CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, silicon (Si), poly(para-phenylene vinylene) or a derivative thereof, poly(3-alkylthiophene), and poly(paraphenylene).

The first conductive semiconductor layer of the ultra-thin LED element may be an n-type III-nitride semiconductor layer, the second conductive semiconductor layer may be a p-type III-nitride semiconductor layer, and the ultra-thin LED element may further include at least one film of a hole pushing film which surrounds an exposed side surface of the second conductive semiconductor layer or the exposed side surface of the second conductive semiconductor layer and an exposed side surface of at least a portion of the photoactive layer to move holes at a side of the exposed side surface toward a center and an electron pushing film which surrounds an exposed side surface of the first conductive semiconductor layer to move electrons at a side of the exposed side surface side toward a center.

The ultra-thin LED element may include both the hole pushing film and the electron pushing film, and the electron pushing film may be provided as an outermost film surrounding the side surfaces of the first conductive semiconductor layer, the photoactive layer, and the second conductive semiconductor layer.

The hole pushing film may include at least one selected from among $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$.

The electron pushing film may include at least one selected from among $Al_2O_3$, $HfO_2$, $SiN_x$, $SiO_2$, $ZrO_2$, $Sc_2O_3$, $AlN_x$, and $Ga_2O_3$.

The micro-nanofin LED element may have a length of 100 nm to 10,000 nm and a thickness of 100 nm to 3,000 nm.

A ratio of the length and the thickness of the micro-nanofin LED element may be 3:1 or more.

A protrusion having a certain width and thickness in an element length direction may be formed on a lower surface of the first conductive semiconductor layer of the micro-nanofin LED element.

A width of the protrusion may have a length of 50% or less of a width of the micro-nanofin LED element.

A light emitting area of the micro-nanofin LED element may exceed twice an area of a longitudinal cross section of the micro-nanofin LED element.

Pores may be formed in a portion of the first conductive semiconductor layer (n-type conductive semiconductor layer) of the ultra-thin LED element (dot, disc, and/or micro-nanofin type LED element).

The LED electrode assembly may be formed on a flexible substrate.

According to another aspect of the present invention, there is provided a transfer film used for manufacturing the above-described LED electrode assembly using a laser-assisted multi-chip transfer printing method, the transfer film including a donor film, and a plurality of ultra-thin LED elements arranged on the donor film, wherein each of the plurality of ultra-thin LED elements includes a second conductive semiconductor layer, a photoactive layer, and a first conductive semiconductor layer which are stacked, and the ultra-thin LED element is erected and disposed such that the second conductive semiconductor layer of the ultra-thin LED element faces the donor film.

According to still another aspect of the present invention, there is provided a manufacturing method of the above-described LED electrode assembly, including performing a process which includes operation 1 of preparing a plurality of lower electrodes on a substrate, and operation 2 of forming a plurality of pixel units on the lower electrodes, wherein, in operation 2, each of the plurality of pixel units includes a plurality of ultra-thin LED elements, and the ultra-thin LED element is formed by being transferred through a laser-assisted multi-chip transfer printing method.

A process including operation 3 of filling a periphery of the ultra-thin LED element with an insulator to form an insulating layer, and operation 4 of forming upper electrodes to be electrically connected to an opposite side of the ultra-thin LED element opposite to one side of the ultra-thin LED element assembled on the lower electrodes may be further performed.

Each of the plurality of ultra-thin LED elements in the pixel unit may include a first conductive semiconductor layer, a photoactive layer, and a second conductive semiconductor layer which are stacked, and the ultra-thin LED element may be erected and disposed such that the second conductive semiconductor layer of the ultra-thin LED element faces the lower electrode.

In the laser-assisted multi-chip transfer printing method that is a printing method, a laser may be radiated onto one surface of a transfer film through openings of a mask to transfer the ultra-thin LED elements onto the lower electrodes to form the pixel unit including the plurality of ultra-thin LED elements on the lower electrodes, the transfer film may include a donor film and the plurality of ultra-thin LED elements arranged on the donor film, and the laser may be radiated from below the donor film.

Each of the plurality of ultra-thin LED elements of the donor film may include a second conductive semiconductor layer, a photoactive layer, and a first conductive semiconductor layer which are stacked, and the ultra-thin LED element may be erected and disposed such that the first conductive semiconductor layer of the ultra-thin LED element faces the donor film.

The donor film may include a polydimethylsiloxane stamp (PDMS) film, a polyimide film including a dynamic release layer, an elastomeric microstructure stamp film, or a shape memory polymer film.

In the transfer of operation 2, the plurality of openings may be formed in the mask, and the laser may be radiated through each of the plurality of openings to simultaneously transfer three or more ultra-thin LED elements per opening onto the lower electrodes.

The plurality of ultra-thin LED elements simultaneously transferred onto the lower electrodes through the laser radiated through the same opening of the mask may form one pixel unit or may form three or four subpixel units, and the three or four subpixel units may form one pixel unit.

The ultra-thin LED element may include at least one selected from among an ultra-thin blue LED element, an ultra-thin green LED element, and an ultra-thin red LED element.

According to yet another aspect of the present invention, there is provided a high-resolution ultra-thin LED display including the above-described ultra-thin LED electrode assembly and having a resolving performance of 450 pixels per inch (PPI) to 3,000 PPI.

Terms used in the present invention are defined.

In descriptions of exemplary embodiments according to the present invention, it will be understood that, when a layer, a region, a pattern, or a substrate is referred to as being "on," "above," "under," or "below" another layer, region, or pattern, the terminology of "on," "above," "under," or "below" includes both the meanings of "directly" and "indirectly."

Meanwhile, the present invention was researched under support of the following Korea R&D Project.

1. [Korea R&D Project Supporting the Present Invention]
[Project Series Number] 1415174040
[Project Number] 20016290
[Government Department Name] Ministry of Trade, Industry and Energy
[Project Management Administration Authority Name] Korea Evaluation Institute of Industrial Technology
[Research Program Name] Electronic Components Industry Technology Development-Supersized Micro-LED Modular Display
[Research Project Name] Development of Sub-Micron Blue Light Source Technology for Modular Display
[Contribution Ratio] ½
[[Name of Project Execution Organization]

Kookmin University Industry Academy Cooperation Foundation
[Period of Research] Apr. 1, 2021 to Dec. 31, 2024
2. [Korea R&D Project Supporting the Present Invention]
[Project Series Number] 1711130702
[Project Number] 2021R 1A2C2009521
[Government Department Name] The Ministry of Science and ICT
[Project Management Administration Authority Name] National Research Foundation of Korea
[Research Program Name] Middle Career Researcher Support Project
[Research Project Name] Development of Dot-LED Material and Display Source/Application Technology
[Contribution Ratio] ½
[Name of Project Execution Organization] Kookmin University Industry Academy Cooperation Foundation
[Period of Research] Mar. 1, 2021 to Jan. 28, 2022

BRIEF DESCRIPTION OF THE DRAWINGS

FIG. 1A-A is a schematic view of a method of transferring existing micro-light-emitting diode (LED) elements using a laser-assisted multi-chip transfer printing method, and FIG. 1A-B is a schematic view of an example of defects of a transferred LED electrode assembly (or an LED display).

FIG. 1B-A is a schematic view of a method of transferring ultra-thin LED elements using a laser-assisted multi-chip transfer printing method, and FIG. 1B-B is a schematic view of an example of defects of a transferred LED electrode assembly (or an LED display).

FIG. 2A, FIG. 2B, FIG. 2C, and FIG. 2D are schematic views of an exemplary example of a laser-assisted multi-chip transfer printing method applied when an ultra-thin LED electrode assembly is manufactured according to the present invention, wherein FIG. 2A is a schematic view of the laser-assisted multi-chip transfer printing method when a polydimethylsiloxane (PDMS) stamp film is applied as a donor film, FIG. 2B is a schematic view of the laser-assisted multi-chip transfer printing method when a polyimide film on which a dynamic release layer is formed is applied as a donor film, FIG. 2C is a schematic view of the laser-assisted multi-chip transfer printing method when an elastomeric microstructure stamp film is applied as a donor film, and FIG. 2D is a schematic view of the laser-assisted multi-chip transfer printing method when a shape memory polymer film is applied as a donor film.

FIG. 19B is a magnified view of FIG. 29A, FIG. 20B is a magnified view of FIG. 20A, and FIG. 19C is a top-down view of FIG. 19A, and FIG. 20C is a top-down view of FIG. 20A.

DETAILED DESCRIPTION OF EXEMPLARY EMBODIMENTS

Figures 2A, 2B, 2C, 2D:
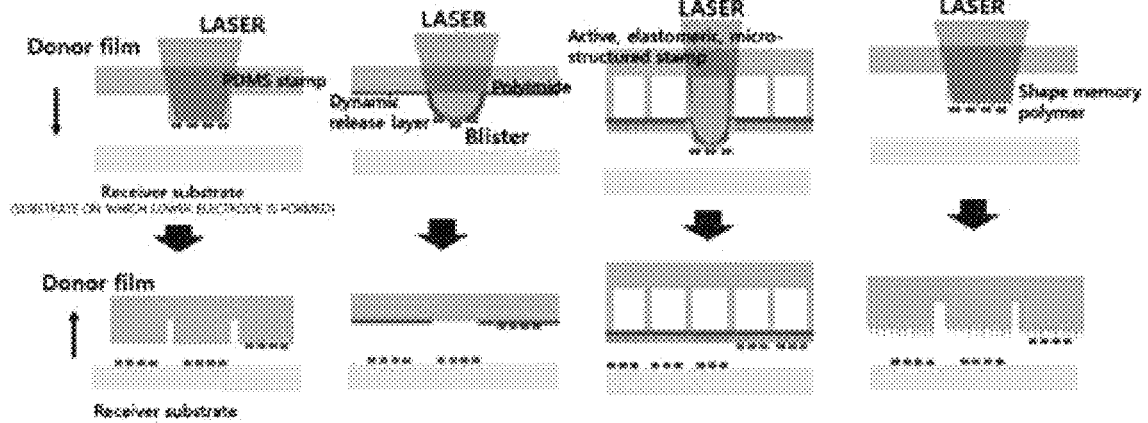

Hereinafter, exemplary embodiments of the present invention will be described in detail so as to be easily practiced by a person of ordinary skill in the art to which the present invention pertains. It should be understood that the present invention may be embodied in various different forms and is not limited to the following exemplary embodiments.

As shown in schematic views of FIGS. 1A-A and 1A-B, in a display manufactured using existing micro-light-emitting diodes (LEDs) through a laser-assisted transfer printing method, since each pixel includes one micro-LED element or a small number of micro-LED elements when an electrode LED assembly is formed, there has been a problem in that dark spots are generated due to omission (vacancies) of LED elements during transfer, deviation thereof from an electrode line (misalignment), and the like. However, as shown in schematic views of FIGS. 1B-A and 1B-B, in the present invention, since an electrode LED assembly is manufactured using a film including ultra-thin LED elements and a laser-assisted multi-chip transfer printing method to constitute a plurality of ultra-thin LED elements in a subpixel, even when some of the LED elements are omitted during transfer or deviate from an electrode line, the LED elements are operated without vacancies or misalignment in a pixel unit. Thus, dark spots are not generated, thereby preventing display defects. Furthermore, the present invention may provide an ultra-thin LED electrode assembly and a high-resolution LED display capable of securing high resolving power (pixels per inch (PPI)).

The ultra-thin LED electrode assembly of the present invention is manufactured using a transfer film including ultra-thin LED element and a laser-assisted multi-chip transfer printing method, and the transfer film includes a donor film and the plurality of ultra-thin LED elements arranged on the donor film.

The plurality of ultra-thin LED elements of the transfer film each include a second conductive semiconductor layer, a photoactive layer, and a first conductive semiconductor layer, which are stacked, and are erected and disposed such that the second conductive semiconductor layer faces the donor film.

When a laser is radiated in the direction of the donor film of the transfer film to transfer the ultra-thin LED elements onto a receiver film (or a lower electrode formed on a substrate of the LED electrode assembly), an order of layers in the LED element is reversed, thereby forming the ultra-thin LED element having a form in which the first conductive semiconductor layer, the photoactive layer, and the second conductive semiconductor layer are sequentially stacked.

The donor film may include a polydimethylsiloxane stamp (PDMS) film, a polyimide film including a dynamic release layer, an elastomeric microstructure stamp film, or a shape memory polymer film. Types of the donor film may be selectively used according to a laser-assisted multi-chip transfer printing method applied when the LED electrode assembly is manufactured. In order to help the understanding, schematic diagrams of types of the donor film and the laser-assisted multi-chip transfer printing method are shown in FIG. 2A to 2D.

The ultra-thin LED element of the transfer film will be described in detail together with the LED electrode assembly.

Figure 3A:
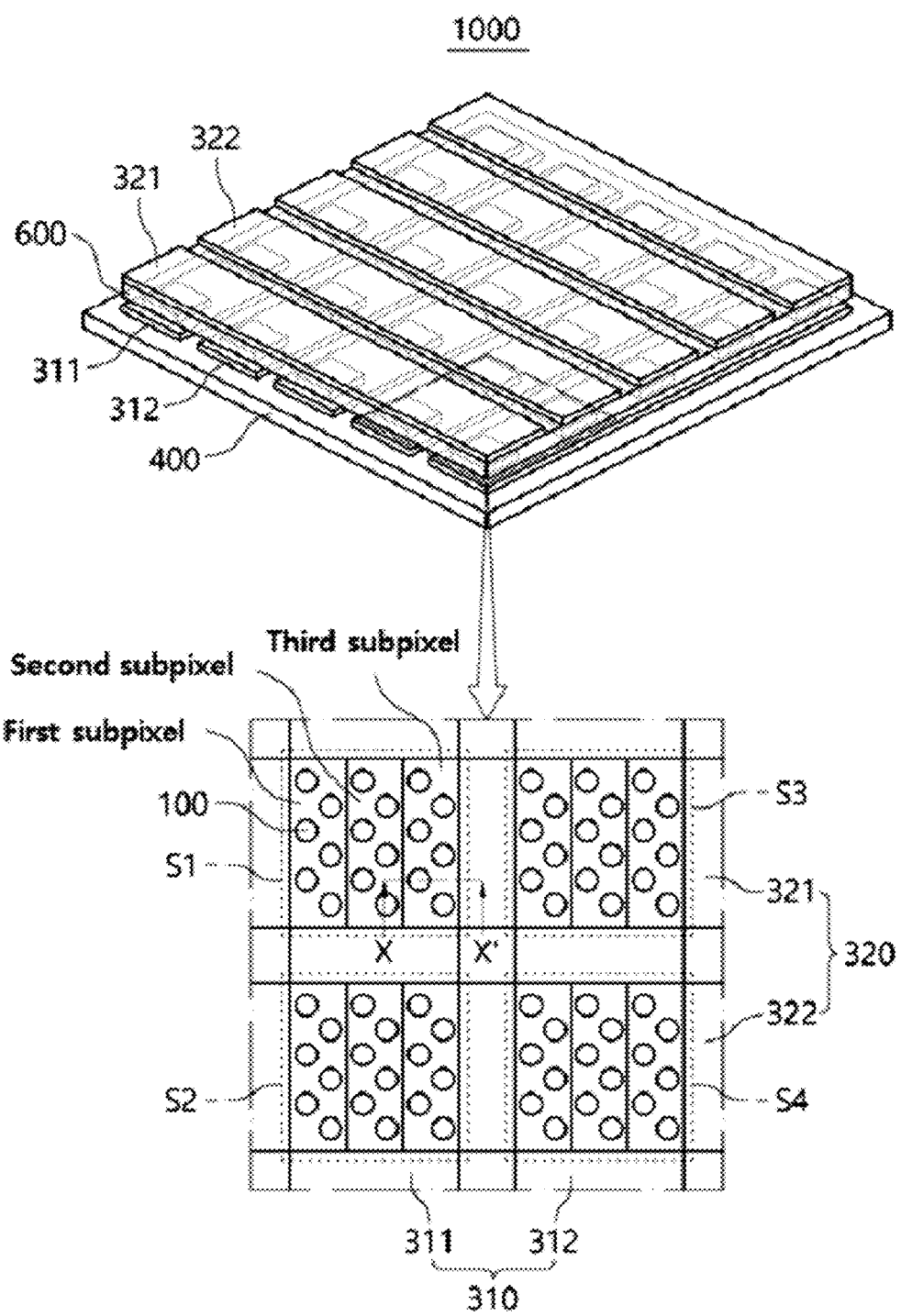
FIG. 3A shows a schematic view of an ultra-thin LED electrode assembly using ultra-thin LED element according to an exemplary embodiment of the present invention and a plan view of some pixels.

As shown in a schematic view of FIG. 3A, the ultra-thin LED electrode assembly of the present invention manufactured through the laser-assisted multi-chip transfer printing method using the transfer film includes an ultra-thin LED electrode assembly including a plurality of lower electrodes 310 formed (provided) on a substrate 400, a plurality of pixel units formed on the lower electrodes, an insulating layer 600 formed on the substrate and the plurality of pixel units, and a plurality of upper electrodes 320 formed on the insulating layer. Each of the plurality of pixel units includes subpixel units each including a plurality of ultra-thin LED elements 100.

The ultra-thin LED element is an ultra-thin LED element formed using the above-described transfer film.

The subpixel unit may include three or more ultra-thin LED elements, preferably 3 to 30 ultra-thin LED elements, and more preferably 5 to 20 ultra-thin LED elements, and the ultra-thin LED element may include at least one LED element selected from among an ultra-thin blue LED element, an ultra-thin green LED element, and an ultra-thin red LED element.

In addition, each of the plurality of pixel units may include three or four subpixel units, and each of the three or four subpixel units may include 3 to 10 ultra-thin LED elements.

According to an exemplary embodiment, for example, as shown in a schematic view of FIG. 3A, when the pixel unit includes three subpixel units, the pixel unit may include a first subpixel unit, a second subpixel unit, and a third subpixel unit.

Each of the three or four subpixel units may have a circular shape, a rectangular shape, or a square shape, and when each of the three or four subpixel units has the rectangular shape, each of the three or four subpixel units may have an aspect ratio of 1:2.0 to 1:4.0.

In addition, each of the plurality of pixel units may include the first subpixel unit including the ultra-thin blue LED element, the second subpixel unit including the ultra-thin green LED element, and the third subpixel unit including the ultra-thin red LED element.

In addition, when the display is a color-by-blue type display, the three or four subpixel units constituting each of the plurality of pixel units may all include the ultra-thin blue LED element, and in this case, one or more color conversion layers selected from a green color conversion layer and a red color conversion layer may be further stacked on the upper electrode.

Any material that may be used in a color-by-blue manner may be used for the green color conversion layer without limitation. As an exemplary example, the green color conversion layer may include at least one phosphor selected from among $SrGa_2S_4:Eu$, $(Sr,Ca)_3SiO_5:Eu$, $(Sr,Ba,Ca)SiO_4:Eu$, $Li_2SrSiO_4:Eu$, $Sr_3SiO_4:Ce,Li$, $\beta$-SiALON:Eu, $CaSc_2O_4:Ce$, $Ca_3Sc_2Si_3O_{12}:Ce$, Cα-SiALON:Yb, Cα-SiALON:Eu, Liα-SiALON:Eu, $Ta_3Al_5O_{12}:Ce$, $Sr_2Si_5N_8:Ce$, $SrSi_2O_2N_2:Eu$, $BaSi_2O_2N_2:Eu$, $Ba_3Si_6O_{12}N_2:Eu$, $\gamma$-AlON:Mn, and $\gamma$-AlON:Mn,Mg, but the present invention is not limited thereto.

Any material that may be used in a color-by blue manner may be used for the green color conversion layer without limitation. As another exemplary example, the green color conversion layer may include one or more quantum dots or nanoparticles selected from among InP/ZnSe/ZnS quantum dots, InP/ZnSeS/ZnS quantum dots, InP/GaP/ZnS quantum dots, ZnSe/ZnS quantum dots, and $CsPbBr_3$ nanoparticles, and $Cs_3MnBr_5$ nanoparticles, but the present invention is not limited thereto.

Any material that may be used in a color-by blue manner may be used for the red color conversion layer without limitation. As an exemplary example, the red color conversion layer may include at least one phosphor selected from among $(Sr,Ca)AlSiN_3:Eu$, $CaAlSiN_3:Eu$, $(Sr,Ca)S:Eu$, $_{CaSiN2}:Ce$, $SrSiN_2:Eu$, $Ba_2Si_5N_8:Eu$, CaS:Eu, CaS:Eu,Ce, SrS:Eu, SrS:Eu,Ce, and $Sr_2Si_5N_8:Eu$, but the present invention is not limited thereto. For another example, the red conversion layer may include one or more quantum dots or nanoparticles selected from among InP/ZnSe/ZnS quantum dots, InP/ZnSeS/ZnS quantum dots, InP/GaP/ZnS quantum dots, ZnSe/ZnS quantum dots, $CsPb(Br,I)_3$ nanoparticles, and $CsMnBr_3$ nanoparticles, but the present invention is not limited thereto.

In addition, at least one pass filter selected from a short wavelength pass filter (SWPF) and a long wavelength pass filter (LWPF) may be further formed between the upper electrode and the color conversion layer. The short wavelength pass filter may be a multi-layered film in which thin films made of a high refractive material and a low refractive material are repeated. As an exemplary example, the short wavelength pass filter may be $[0.5SiO_2/TiO_2/0.5SiO_2]^m$ (m=the number of repeated layers and m is 7 or more) but is not limited thereto. In addition, the long wavelength pass filter may be a multi-layered film in which thin films made of a high refractive material and a low refractive material are repeated. As an exemplary example, the long wavelength pass filter may be $[0.5TiO_2/SiO_2/0.5TiO_2]^m$ (m=the number of repeated layers and m is 7 or more).

Each of the plurality of ultra-thin LED elements constituting the subpixel unit is an LED element in which the first conductive semiconductor layer, the photoactive layer, and the second conductive semiconductor layer are stacked. The ultra-thin LED element may be erected and disposed in the subpixel unit such that the first conductive semiconductor layer of the ultra-thin LED element faces the lower electrode.

A cross-sectional shape of the ultra-thin LED element may include at least one shape selected from among a circular shape, an oval shape, and a polygonal shape (a triangular shape, aa square shape, a pentagonal shape, a hexagonal shape, an octagonal shape, a decagonal shape, a trapezoidal shape, a rhombic shape, or a star shape), and the plurality of ultra-thin LED elements may be provided as elements having the same cross-sectional shape or elements having different cross-sectional shapes may be mixed to constitute the subpixel unit.

In addition, the ultra-thin LED element may be a dot type or disc type LED element (first type), or a micro-nanofin LED element (second type).

In addition, a maximum surface area of the ultra-thin LED element may be ⅓ or less of an area of the subpixel, preferably in a range of 1/50 to ⅓ thereof, and more preferably in a range of 1/30 to ⅓ thereof.

The first conductive semiconductor layer of the ultra-thin LED element is an n-type III-nitride semiconductor layer. The ultra-thin LED element may further include an electron delay layer on an opposite surface opposite to one surface of the first conductive semiconductor layer adjacent to the photoactive layer such that the numbers of electrons and holes recombined in the photoactive layer are balanced.

In addition, the electron delay layer may be a III-nitride semiconductor having a lower doping concentration than the first conductive semiconductor layer.

Furthermore, the second conductive semiconductor layer of the ultra-thin LED element is a p-type III-nitride semiconductor layer. The ultra-thin LED element may further include an electron delay layer on an opposite surface opposite to one surface of the second conductive semiconductor layer adjacent to the photoactive layer such that the numbers of electrons and holes recombined in the photoactive layer are balanced.

Furthermore, the electron delay layer may include at least one selected from among CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, silicon (Si), poly(para-phenylene vinylene) or a derivative thereof, poly(3-alkylthiophene), and poly(para-phenylene).

Furthermore, the first conductive semiconductor layer of the ultra-thin LED element is an n-type III-nitride semiconductor layer, and the second conductive semiconductor layer thereof is a p-type III-nitride semiconductor layer. The ultra-thin LED element may further include at least one thin film of a hole pushing film which surrounds an exposed side surface of the second conductive semiconductor layer or the exposed side surface of the second conductive semiconductor layer and an exposed side surface of at least a portion of the photoactive layer to move holes at a side of the exposed side surface toward the center and an electron pushing film which surrounds an exposed side surface of the first conductive semiconductor layer to move electrons at a side of the exposed side surface toward the center.

In addition, the ultra-thin LED element may include both the hole pushing film and the electron pushing film, and the electron pushing film may be provided as an outermost film surrounding the side surfaces of the first conductive semiconductor layer, the photoactive layer, and the second conductive semiconductor layer.

Furthermore, the hole pushing film may include at least one selected from among $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$.

Also, the electron pushing film may include at least one selected from among $Al_2O_3$, $HfO_2$, $SiN_x$, $SiO_2$, $ZrO_2$, $Sc_2O_3$, $AlN_x$, and $Ga_2O_3$.

In the ultra-thin LED electrode assembly, the substrate is preferably a flexible substrate.

In addition, the lower electrodes may be implemented as various known electrode patterns through a known method, and the present invention is not particularly limited thereto.

As an example shown in FIG. 3A, a plurality of lower electrodes 311 and 312 may be implemented as patterns which are spaced a certain interval from each other and arranged in parallel.

In addition, as an example, the substrate 400 may include any one of a glass substrate, a quartz substrate, a sapphire substrate, a plastic substrate, and a flexible polymer film that is bendable. As another example, the substrate 400 may be transparent. However, the present invention is not limited to the listed types, and any type of a substrate capable of typically forming an electrode may be used.

An area of the substrate 400 (or the base substrate) is not limited and may be changed in consideration of an area of the lower electrodes 311 and 312 formed on the substrate 400. In addition, the substrate 400 may have a thickness of 100 μm to 1 mm, but the present invention is not limited thereto.

Furthermore, the LED electrode assembly may be encapsulated with an encapsulant.

When a manufacturing method of the above-described ultra-thin LED electrode assembly of the present invention is described, the ultra-thin LED electrode assembly may be manufactured by performing a process including operation 1 of providing a plurality of lower electrodes formed on a substrate and operation 2 of forming a plurality of pixel units on the lower electrodes.

In addition, a process including operation 3 of filling a periphery of an ultra-thin LED element with an insulator to form an insulating layer and operation 4 of forming upper electrodes to be electrically connected to an opposite side of the ultra-thin LED element opposite to one side of the ultra-thin LED element assembled on the lower electrode may be further performed.

Each of the plurality of pixel units in operation 2 may be formed of subpixel units each including a plurality of ultra-thin LED elements. The subpixel unit may be formed by printing the plurality of ultra-thin LED element on the lower electrodes through a laser-assisted multi-chip transfer printing method.

More specifically, in the laser-assisted multi-chip transfer printing method, a laser may be radiated onto one surface of the transfer film through openings of a mask having a plurality of openings to transfer the ultra-thin LED elements onto the lower electrodes to form the pixel unit including the plurality of ultra-thin LED elements on the lower electrodes.

A laser may be radiated through each of the plurality of openings to simultaneously transfer three or more ultra-thin LED elements, preferably, about 3 to 10 ultra-thin LED elements per opening on the lower electrodes, and in this case, an amount of the transferred ultra-thin LED elements may be controlled by adjusting the size of the opening of the mask and the arrangement, number, and/or size of the ultra-thin LED elements formed on the donor film of the transfer film.

In this case, as described above, the transfer film may include the donor film and the plurality of ultra-thin LED elements arranged on the donor film, and the transferring may be performed by radiating a laser from below the donor film. When the ultra-thin LED element is transferred by radiating a laser in the direction of the donor film of the transfer film, the order of the layers in the ultra-thin LED element is reversed. Thus, it is possible to form and arrange the ultra-thin LED element having a form in which the first conductive semiconductor layer, the photoactive layer, and the second conductive semiconductor layer are sequentially stacked on the lower electrode.

In this case, as shown in schematic views of FIG. 2, the laser-assisted multi-chip transfer printing method may be performed in various ways. As described above, it is preferable that the donor film in the transfer film be used according to the laser-assisted multi-chip transfer printing method.

In the present invention, by using the transfer film, the pixel unit (or the subpixel unit) is formed on the lower electrode through the laser-assisted multi-chip transfer printing, thereby preventing a p-n junction of the ultra-thin LED element in the pixel unit (or the subpixel unit) from being reversed, which occurs at a high rate when the pixel unit is formed through an existing inkjet printing method or the like.

The plurality of ultra-thin LED elements simultaneously transferred onto the lower electrode through a laser radiated through the same opening of the mask may form one pixel unit or one subpixel unit, and three or four subpixel units may form one pixel unit (see FIG. 3A).

Descriptions of the ultra-thin LED element used in the manufacturing method of the present invention are the same as the above descriptions of the ultra-thin LED element of the ultra-thin LED electrode assembly.

In the manufacturing method of the ultra-thin LED electrode assembly of the present invention, between processes of operations 2 and 4, an operation of forming an insulating layer 600 having a certain thickness on the lower electrode line 310 for electrical insulation from an upper electrode line 320 may be further performed. The insulating layer 600 may be formed by depositing a known insulating material. As an example, an insulating material such as $SiO_2$ or $SiN_x$ may be deposited through a plasma enhanced chemical vapor deposition (PECVD) method, an insulating material such as AlN or GaN may be deposited through a metal-organic chemical vapor deposition (MOCVD) method, or an insulating material such as $Al_2O$, $HfO_2$, or $ZrO_2$ may be deposited through an atomic layer deposition (ALD) method. Meanwhile, it is preferable that the insulating layer 600 be formed to not cover upper surfaces of ultra-thin LED elements 104, 105, and 106 which are erected and assembled. To this end, an insulating layer may be formed through deposition to a thickness to not cover the upper surfaces of the ultra-thin LED elements 104, 105, and 106, or after an insulating layer is deposited to a thickness to cover the upper surfaces of the ultra-thin LED elements 104, 105, and 106, dry etching may be performed before the upper surfaces of the ultra-thin LED elements 104, 105, and 106 are exposed.

In the manufacturing method of the ultra-thin LED electrode assembly of the present invention, as operation 4, an operation of forming the upper electrode line 320 including upper electrodes 321 and 322 to be electrically connected to an opposite side opposite to one side of the ultra-thin LED elements 104, 105, and 106 electrically connected to the lower electrodes 311 and 312 is performed. An electrode line may be patterned using known photolithography to then deposit an electrode material, or an electrode material may be deposited and then be dry- and/or wet-etched, thereby implementing the upper electrode line 320. In this case, the electrode material may be a typical electrode material used as an electrode of an electrical/electronic material, and the present invention is not particularly limited thereto.

The high-resolution ultra-thin LED display using the above-described ultra-thin LED electrode assembly of the present invention may have a resolving power of 450 PPI to 3,000 PPI, preferably a resolving power of 600 PPI to 2,000 PPI, and more preferably a resolving power of 800 PPI to 2,000 PPI. Even when an existing micro-LED display having a resolving power of 1,000 PPI or less is manufactured, there is a problem in that dark spots occur due to vacancies of LED elements and misalignment thereof, and the like. However, in the present invention, even when a display having a resolving power of 1,000 PPI to 3,000 PPI is manufactured, a subpixel includes a plurality of LED elements. Thus, it is possible to prevent the occurrence of defects such as dark spots due to vacancies of the LED elements and misalignment thereof.

In addition, the high-resolution ultra-thin LED display of the present invention may have a brightness of 100,000 $cd/m^2$ or more and a fast response time of 0.1 ms or less, thereby being applied to various displays. As an exemplary example, the high-resolution ultra-thin LED display may be applied to a television (TV), a smartphone, a notebook, a monitor, a tablet personnel computer, an augmented reality (AR) device, and a virtual reality (VR) device.

Hereinafter, exemplary embodiments will be described differentiating a case in which the ultra-thin-LED electrode assembly uses first type ultra-thin LED elements (dot type or disc type ultra-thin LED elements) and a case in which the ultra-thin-LED electrode assembly uses second type ultra-thin LED elements (micro-nanofin ultra-thin LED elements).

[First (Dot or Disc) Type Ultra-Thin LED Electrode Element and LED Electrode Assembly]

An LED electrode assembly manufactured using first type ultra-thin LED elements will now be described with reference to FIGS. 3A and 3B.

An ultra-thin LED electrode assembly 1000 according to an exemplary embodiment of the present invention includes a lower electrode line 310 including lower electrodes 311 and 312, a plurality of ultra-thin LED elements 101 disposed on the lower electrodes 311 and 312, and an upper electrode line 320 including upper electrodes 321 and 322 disposed in contact with upper portions of the ultra-thin LED elements 101.

First, prior to a detailed description of each component, electrode lines for allowing the ultra-thin LED elements to emit light will be described.

The ultra-thin LED electrode assembly 1000 includes the upper electrode line 320 and the lower electrode line 310 disposed at an upper side and a lower side to face each other with the ultra-thin LED elements 101 interposed therebetween. Since the upper electrode line 320 and the lower electrode line 310 are not arranged in a horizontal direction, an electrode design may be very simplified and more easily implemented by breaking away from a complicated electrode line of a conventional electrode assembly using electric field induction, in which two types of electrodes implemented to have an ultra-thin thickness and width are arranged at intervals of a micro or nano unit within a planar surface with a limited area in the horizontal direction.

Figure 3B:
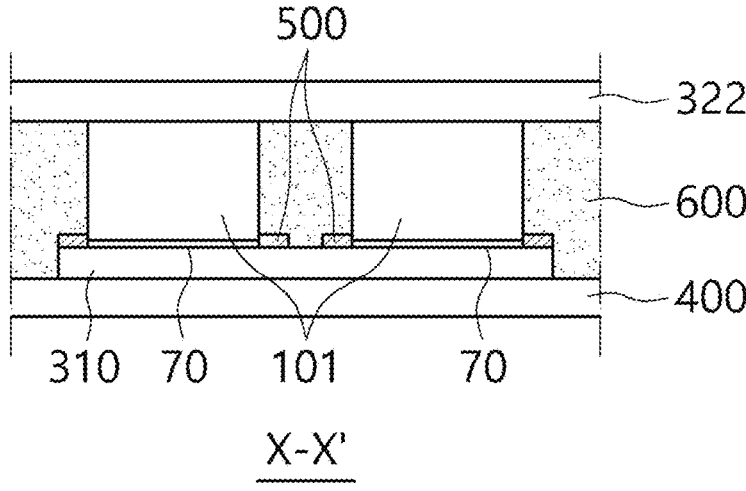
FIG. 3B is a cross-sectional view along boundary line X-X' of FIG. 3B.

In particular, as shown in FIGS. 3A and 3B, irrespective of an electrode design of the lower electrode line 310, since the upper electrode line 320 only needs to be disposed in electrical contact with upper surfaces of the disposed ultra-thin LED elements 101, there is an advantage in that an electrode is very easily designed or implemented. In particular, although FIG. 3A illustrates that the upper electrodes 321 and 322 are independent, since only one upper electrode may be implemented to be in contact with the upper surfaces of all the disposed ultra-thin LED elements, there is an advantage in that an electrode line is implemented in a much more simplified form than in the related art.

In addition, the lower electrode line 310 and the upper electrode line 320 may include the plurality of lower electrodes 311 and 312 and the plurality of upper electrodes 321 and 322, respectively, and since the numbers, intervals, and arrangement shapes thereof may be appropriately modified in consideration of the size of an LED electrode assembly to be implemented, the present invention is not particularly limited in that respect.

Furthermore, when the upper electrode line 320 is designed to be in electrical contact with the upper portion of the ultra-thin LED element 101 mounted on the lower electrode line 310, there is no limitation on the number, arrangement, or the like thereof. However, when the lower electrode lines 310 are arranged in parallel in one direction as shown in FIG. 3A, the upper electrode line 320 may be arranged to be perpendicular to the one direction. Since such an electrode arrangement is an electrode arrangement widely used in the conventional display field, there is an advantage in that an electrode arrangement and control technology of the conventional display field can be used without any change.

In addition, since the lower electrode line 310 and the upper electrode line 320 may have a material, shape, width, and thickness of an electrode used in a typical LED electrode assembly and may be manufactured using a known method, the present invention is not specifically limited in that respect. As an example, the lower electrodes 311 and 312 and the upper electrodes 321 and 322 may each independently be made of aluminum, chromium, gold, silver, copper, graphene, indium tin oxide (ITO), aluminum zinc oxide (AZO), or an alloy thereof and may have a width of 0.1 μm to 50 μm and a thickness of 0.1 μm to 100 μm, and may also be appropriately changed in consideration of the size or the like of a desired LED electrode assembly.

According to an exemplary embodiment of the present invention, arrangement regions $S_1$, $S_2$, $S_3$, and $S_4$ in which the ultra-thin LED elements 101 are to be disposed may be formed in the lower electrodes 311 and 312. The arrangement regions $S_1$, $S_2$, $S_3$, and $S_4$ may be very variously set according to the purpose and may be set a certain interval from each other as shown in FIG. 3A, or an entire region on the lower electrodes 311 and 312 may become an arrangement region unlike what shown in FIG. 3A.

Next, the ultra-thin LED element 101 disposed between the lower electrode line 310 and the upper electrode line 320 described above will be described.

Figure 4:
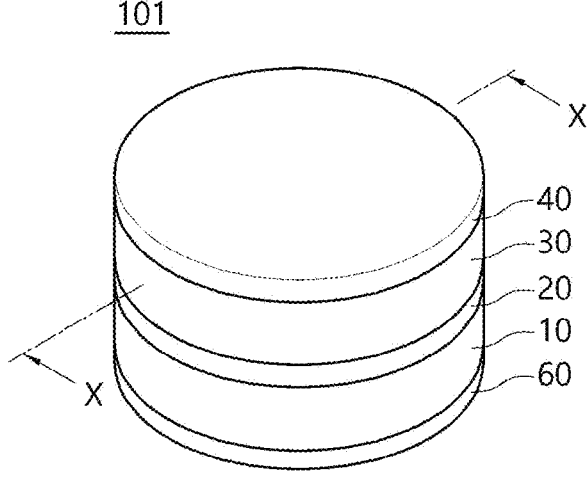
FIG. 4 is a perspective view of an ultra-thin LED element (first type) used in an exemplary embodiment of the present invention.
Figure 5:
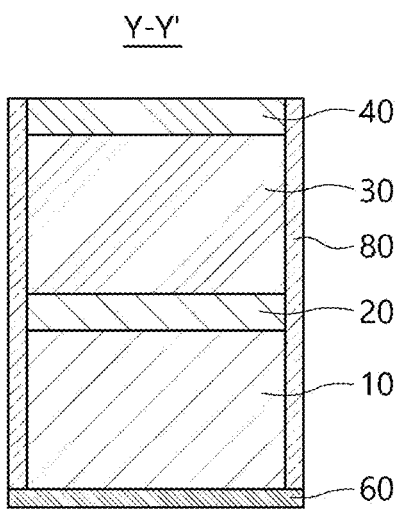
FIG. 5 is a cross-sectional view along boundary line Y-Y' of FIG. 3.

Referring to FIGS. 4 and 5, the ultra-thin LED element 101 according to the exemplary embodiment of the present invention includes a first conductive semiconductor layer 10, a photoactive layer 20, and a second conductive semiconductor layer 30. In addition, the ultra-thin LED element 101 may further include an upper electrode layer 60 formed under the first conductive semiconductor layer 10 and a lower electrode layer 40 formed on the second conductive semiconductor layer 30.

The above-described layers are stacked in any one direction. In a dot LED, a ratio between a thickness in a stacking direction and a length of a major axis in a cross section perpendicular to the stacking direction may satisfy a range of 1:0.5 to 1:1.5, preferably a range of 1:0.8 to 1:1.2, and more preferably a range of 1:0.9 to 1:1.1.

In addition, in a disc LED, a ratio between a thickness in a stacking direction and a length of a major axis in a cross section perpendicular to the stacking direction may satisfy a range of 1:1.5 to 1:5.0, preferably a range of 1:1.5 to 1:3.0, and more preferably a range of 1:1.5 to 1:2.5. Thus, when the ultra-thin LED elements are implemented into an inkjet ink, the ultra-thin LED elements may exhibit excellent dispersibility in a dispersion medium and may be advantageous in maintaining a dispersed state without precipitation for a long time.

In addition, due to such a geometrical structure suitable to be made into an ink, since there is no need for a separate additive for maintaining a dispersed state, there is an advantage in that contamination of the lower electrode line 310 or a circuit board due to the separate additive can be prevented. Furthermore, when printing performed on the lower electrode line 310 using an ink including the ultra-thin LED elements, conventional nanorod-type LED elements having a large aspect ratio mostly lie down to be positioned on an electrode, and the ultra-thin LED elements have an advantage in that a probability of the ultra-thin LED elements lying down when arranged on an electrode can be reduced. In addition, it is possible to reduce a probability of a plurality of elements being assembled in different directions when assembled on an electrode in a thickness direction thereof, in other words, a probability of a p-type conductive semiconductor layer and an n-type conductive semiconductor layer being assembled on a lower electrode in different directions, thereby reducing electrical leakage caused due to a reverse arrangement and improving a lifetime. Here, the length of the major axis is a diameter when a cross-sectional shape is a circular shape, a length of a major axis when a cross-sectional shape is an oval shape, and a length of the longest side when a cross-sectional shape is a polygonal shape. Meanwhile, the above-described cross section is the largest surface of cross sections when the cross sections of the ultra-thin LED element are not the same in a thickness direction thereof.

In addition, a ratio between a length of a minor axis and a length of a major axis in the cross section may also satisfy a range of 1:0.5 to 1:1.5, preferably a range of 1:0.8 to 1:1.2, and more preferably a range of 1:0.9 to 1:1.1, and thus it may be more advantageous in achieving the above object of the present invention. Even if a ratio between a thickness and a length of a major axis satisfies a range of 1:0.5 to 1:1.5, when a ratio between a length of a minor axis and the length of the major axis in a cross section deviates from a range of 1:0.5 to 1:1.5, since it is difficult for an LED element to maintain a dispersed state in a dispersion medium for a long time, the LED element may be unsuitable to be made into an ink. In addition, in order to keep an LED element with such a geometry unsuitable for being made into an ink dispersed in a dispersion medium for a long time, an additive should be further contained, and there is a risk of causing a problem of contaminating a driving electrode or a circuit board due to the use of the additive. Here, a length of a minor axis in a cross section is the longest length among lengths of axes perpendicular to a major axis.

Meanwhile, in an ultra-thin LED element 101 shown in FIG. 4, although cross sections of layers perpendicular to a stacking direction are illustrated as being the same size, the present invention is not limited thereto, and sizes of the cross sections may be different according to thicknesses.

In addition, a shape of the ultra-thin LED element 101 may be a cylindrical shape as shown in FIG. 4 but is not limited thereto. The shape of the ultra-thin LED element 101 may be an atypical shape having a star-shaped surface as well as a polyhedral shape having a hexahedral surface, an octahedral surface, or a decahedral surface.

According to an exemplary embodiment of the present invention, a maximum surface area of the ultra-thin LED element 101 may be 25 $\mu m^2$ or less, preferably 9 $\mu m^2$ or less, and more preferably 4 $\mu m^2$ or less. Here, the maximum surface area is a maximum value among planar areas of the LED element. When the maximum surface area exceeds 25 $\mu m^2$, a sedimentation rate may be high, and thus there may be a risk of degrading dispersion retention performance, and there may be a limitation in that the LED element is not suitable to be made into an ink, a separate additive should be further added to make the LED element into an ink, or a specific dispersion medium should be used.

According to an exemplary embodiment of the present invention, the ultra-thin LED element 101 may have a thickness of 2.5 $\mu m$ or less and more preferably a thickness of 1.5 $\mu m$ or less and thus may be more suitable for maintaining a dispersed state for a long time when made into an ink.

However, when an LED element is implemented to be thin, a position at which electrons and holes combine deviates from the photoactive layer 20, resulting in a decrease in luminous efficiency. In particular, when a large-area LED wafer is etched to implement the ultra-thin LED elements, thicknesses of the first conductive semiconductor layer, the photoactive layer, and the second conductive semiconductor layer are previously determined in a state of the LED wafer. In this case, in order to achieve a certain level of luminous efficiency, only a part is etched to have a thickness different from the previously determined thickness of each layer in the wafer to implement the ultra-thin LED elements, and thus such a problem inevitably arises. Such a change in a position at which electrons and holes combine is caused by a difference in velocity between electrons and holes moving through the conductive semiconductor layers. For example, in an n-type GaN conductive semiconductor layer, mobility of electrons is 200 $cm^2/Vs$, but in a p-type GaN conductive semiconductor layer, mobility of holes is only 5 $cm^2/Vs$. Due to such an imbalance in electron-hole velocity, a position at which electrons and holes combine may be changed according to thicknesses of the p-type GaN conductive semiconductor layer and the n-type GaN conductive semiconductor layer and may deviate from the photoactive layer.

Figure 6:
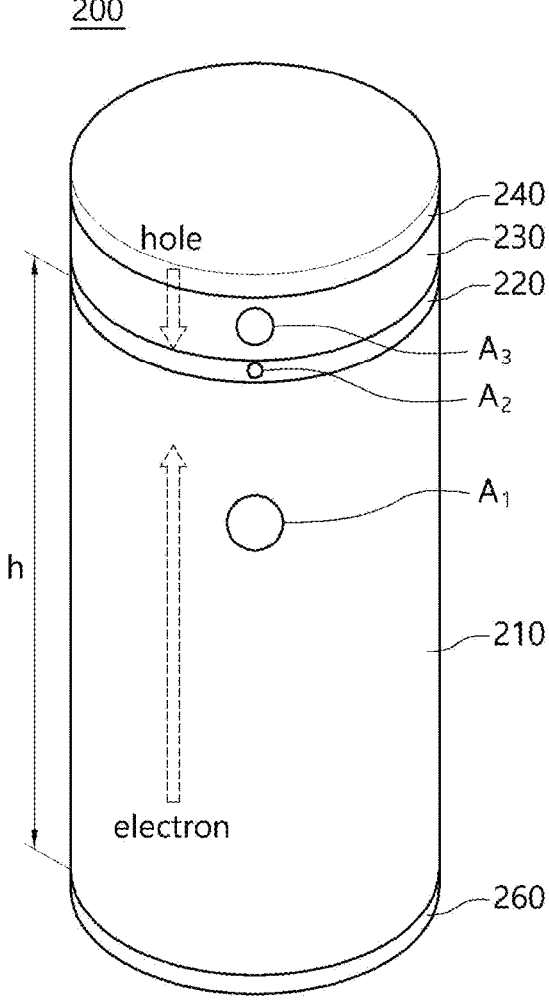
FIG. 6 is a schematic view for describing a balance between electrons and holes in an LED element.

When this is described with reference to FIG. 6, in an LED element 200 having a diameter of about 600 nm and including an n-type GaN conductive semiconductor layer 210, a photoactive layer 220, and a p-type GaN conductive semiconductor layer 230 which are stacked, when a thickness is designed such that the numbers of electrons and holes recombined at a point A2 in the photoactive layer 220 are balanced in consideration of electron mobility of the n-type GaN conductive semiconductor layer 210 and hole mobility of the p-type GaN conductive semiconductor layer 230, a thickness h of the n-type GaN conductive semiconductor layer 210 should be inevitably thick, and thus, unless a thickness of the p-type GaN conductive semiconductor layer

230 is implemented to be very thin, a rod-type LED element is highly likely to be implemented. In other words, in the case of an LED element in which a thickness of each layer is designed such that a position at which the numbers of recombined electrons and holes are balanced is at the photoactive layer 220, as a length of a major axis in a cross section perpendicular to a thickness direction is decreased, an aspect ratio between the thickness of the LED element and the major axis of the cross section is inevitably further increased. In addition, when the n-type GaN conductive semiconductor layer 210 is implemented to be thin, a position, at which the numbers of recombined electrons and holes are balanced, may be positioned at any point A3 in the p-type GaN conductive semiconductor layer 230, resulting in a decrease in luminous efficiency.

Accordingly, the ultra-thin LED element provided in an exemplary embodiment of the present invention may further includes an electron delay layer adjacent to the n-type conductive semiconductor layer in order to prevent a decrease in luminous efficiency by balancing the numbers of holes and electrons recombined in the photoactive layer. When this will be described with reference to FIG. 7, assuming that a first conductive semiconductor layer is an n-type conductive semiconductor, an ultra-thin LED element 102 may include an electron delay layer 50 on a first conductive semiconductor layer 10, and thus even when a thickness of the first conductive semiconductor layer 10 is implemented to be thin, a decrease in luminous efficiency can be prevented. In addition, since the reduced thickness of the first conductive semiconductor layer 10 reduces a probability of electrons being captured by surface defects while moving in a thickness direction of the first conductive semiconductor layer 10, there is an advantage in that an emission loss can be minimized.

The electron delay layer 50 may include, for example, at least one selected from among CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, $S_1$, poly(para-phenylene vinylene) or a derivative thereof, poly(3-alkylthiophene, and poly(paraphenylene). In addition, the electron delay layer 50 may have a thickness of of 1 nm to 100 nm, but the present invention is not limited thereto. The thickness of the electron delay layer 50 may be appropriately changed in consideration of a material of the n-type conductive semiconductor layer, a material of the electron delay layer, and the like.

Hereinafter, each layer of the ultra-thin LED element 101 and 102 according to an exemplary embodiment of the present invention will be described in detail.

Any one of the first conductive semiconductor layer 10 and the second conductive semiconductor layer 30 may be an n-type semiconductor layer, and the other may be a p-type semiconductor layer. A known semiconductor layer adopted in an LED may be used as the n-type semiconductor layer and the p-type semiconductor layer without limitation. As an example, the n-type semiconductor layer and the p-type semiconductor layer may include III-V semiconductors referred to as III-nitride materials, in particular, binary, ternary, and quaternary alloys of gallium, aluminum, indium, and nitrogen.

As an example, the first conductive semiconductor layer 10 may be an n-type semiconductor layer, and in this case, the n-type semiconductor layer may include a semiconductor material having an empirical formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, AlGaN, InGaN, AlN, and InN. The n-type semiconductor layer may be doped with a first conductive dopant (for example, Si, germanium (Ge), or tin (Sn)). According to an exemplary embodiment of the present invention, the first conductive semiconductor layer 10 may have a thickness of 100 nm to 1,800 nm, but the present invention is not limited thereto. The thickness of the first conductive semiconductor layer 10 is preferably greater than or equal to that of the second conductive semiconductor layer 30.

In addition, the second conductive semiconductor layer 30 may be a p-type semiconductor layer, and in this case, the p-type semiconductor layer may include a semiconductor material having an empirical formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, AlGaN, InGaN, AlN, and InN. The p-type semiconductor layer may be doped with a second conductive dopant (for example, magnesium (Mg)). According to an exemplary embodiment of the present invention, the second conductive semiconductor layer 30 may have a thickness of 50 nm to 150 nm, but the present invention is not limited thereto. The thickness of the second conductive semiconductor layer 30 is preferably less than or equal to that of the first conductive semiconductor layer 10.

Also, the photoactive layer 20 positioned between the first conductive semiconductor layer 10 and the second conductive semiconductor layer 30 may be formed in a single or multi-quantum well structure. A photoactive layer included in a typical LED element used for lighting, display, and the like may be used as the photoactive layer 20 without limitation. A clad layer (not shown) doped with a conductive dopant may be formed above and/or under the photoactive layer 20 and may be implemented as an AlGaN layer or an InAlGaN layer. In addition, a material such as AlGaN or AlInGaN may be used for the photoactive layer 20. Regarding the photoactive layer 20, when an electric field is applied to the element, electrons and holes move to the photoactive layer from the conductive semiconductor layers positioned on and under the photoactive layer, and electron-hole pairs are generated in the photoactive layer, thereby emitting light. According to an exemplary embodiment of the present invention, the photoactive layer 20 may have a thickness of 50 nm to 200 nm, but the present invention is not limited thereto.

Meanwhile, the upper electrode layer 60 may be provided under the first conductive semiconductor layer 10. Alternatively, the electron delay layer 50 may be further provided between the first conductive semiconductor layer 10 and the upper electrode layer 60. Meanwhile, the lower electrode layer 40 may be provided on the second conductive semiconductor layer 30.

Figure 7:
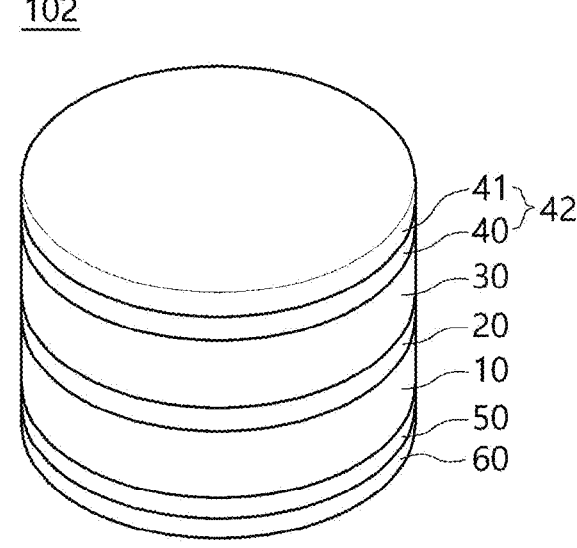
FIG. 7 is a perspective view of an ultra-thin LED element (first type) used in an exemplary embodiment of the present invention.

Electrode layers included in a typical LED element may be used as the lower electrode layer 40 and the upper electrode layer 60 without limitation. The lower electrode layer 40 and the upper electrode layer 60 may each independently be a single layer made of one selected from chromium (Cr), titanium, (Ti), aluminum (Al), gold (Au), nickel (Ni), ITO, and an oxide or alloy thereof, a single layer in which two or more thereof are mixed, or multiple layers in which each of two or more materials thereof constitutes a layer. As an example, as shown in FIG. 7, the ultra-thin LED element 102 may include a lower electrode layer 42 in which an ITO electrode layer 40 and a Ti/Au multi-layer 41 are stacked on the second conductive semiconductor layer 30. In addition, the lower electrode layer 40 and the upper electrode layer 60 may each independently have a thickness of 10 nm to 500 nm, but the present invention is not limited thereto.

In addition, the ultra-thin LED element 101 may further include a protective film 80 which surrounds a side surface of the element when it is assumed that a surface parallel to a stacking direction is the side surface. The protective film 80 performs a function of protecting surfaces of the first conductive semiconductor layer 10, the photoactive layer 20, and the second conductive semiconductor layer 30. In addition, as in a manufacturing method of an ultra-thin LED element to be described below, the protective film 80 may perform a function of protecting the first conductive semiconductor layer 10 in a process of etching an LED wafer in a thickness direction and then separating a plurality of LED pillars.

The protective film 80 may include, for example, at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN) and gallium nitride (GaN). The protective film 80 may have a thickness of 5 nm to 100 nm and more preferably a thickness of 30 nm to 100 nm and thus may be advantageous in protecting the first conductive semiconductor layer 10 in the process of separating the LED pillars which will be described below.

Figure 8:
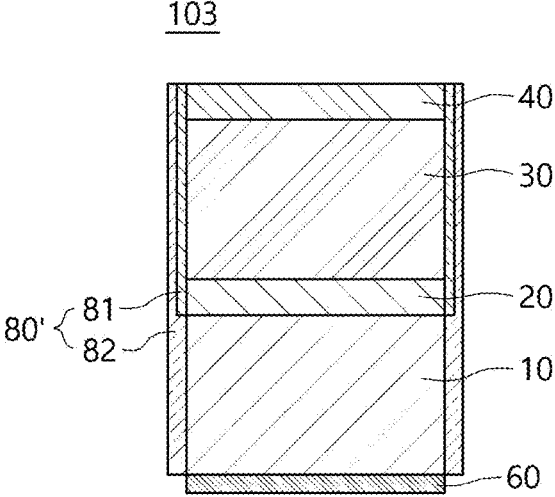
FIG. 8 is a cross-sectional view of an ultra-thin LED element (first type) used in an exemplary embodiment of the present invention.

Meanwhile, as shown in FIG. 8, an ultra-thin LED element 103 according to an exemplary embodiment of the present invention may include a protective film 80', which includes a hole pushing film 81 which surrounds an exposed side surface of a second conductive semiconductor layer 30 or the exposed side surface of the second conductive semiconductor layer 30 and an exposed side surface of at least a portion of a photoactive layer 20 to move holes at a side of the exposed side surface toward the center and an electron pushing film 82 which surrounds an exposed side surface of a first conductive semiconductor layer 10 to move electrons at a side of the exposed side surface toward the center, in order to have improved luminous efficiency in addition to a protective function as a protective film.

Some of charges moving from the first conductive semiconductor layer 10 to the photoactive layer 20 and some of holes moving from the second conductive semiconductor layer 30 to the photoactive layer 20 may move along a side surface. In this case, electrons or holes are quenched due to defects present on the surface, and thus there is a risk of degrading luminous efficiency. In this case, even if a protective film is provided, there is a problem that quenching is unavoidable due to defects occurring on a surface of an element before the protective film is provided. However, when the protective film 80' includes the hole pushing film 81 and the electron pushing film 82, since electrons and holes are concentrated toward the center of the element and are guided and moved toward the photoactive layer, there is an advantage in that it is possible to prevent a loss of luminous efficiency due to surface defects even if there are defects on the surface of the element before the protective film is formed.

The hole pushing film 81 may include, for example, at least one selected from the group consisting of $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$. The electron pushing film 82 may include at least one selected from the group consisting of $Al_2O_3$, $HfO_2$, $SiN_x$, $SiO_2$, $ZrO_2$, $Sc_2O_3$, $AlN_x$, and $Ga_2O_3$.

In addition, as shown in FIG. 8, when the ultra-thin LED element includes both the hole pushing film 81 and the electron pushing film 82, the electron pushing film 82 may be provided as an outermost film which surrounds side surfaces of the first conductive semiconductor layer 10, the photoactive layer 20, and the second conductive semiconductor layer 30.

In addition, the hole pushing film 81 and the electron pushing film 82 may each independently have a thickness of 1 nm to 50 nm.

Meanwhile, the first conductive semiconductor layer 10, the photoactive layer 20, and the second conductive semiconductor layer 30 of the above-described ultra-thin LED element may be included as minimal components of the ultra-thin LED element, and another phosphor layer, a quantum dot layer, another active layer, a semiconductor layer, a hole block layer, and/or an electrode layer may be further included above/under each layer.

Figure 9:
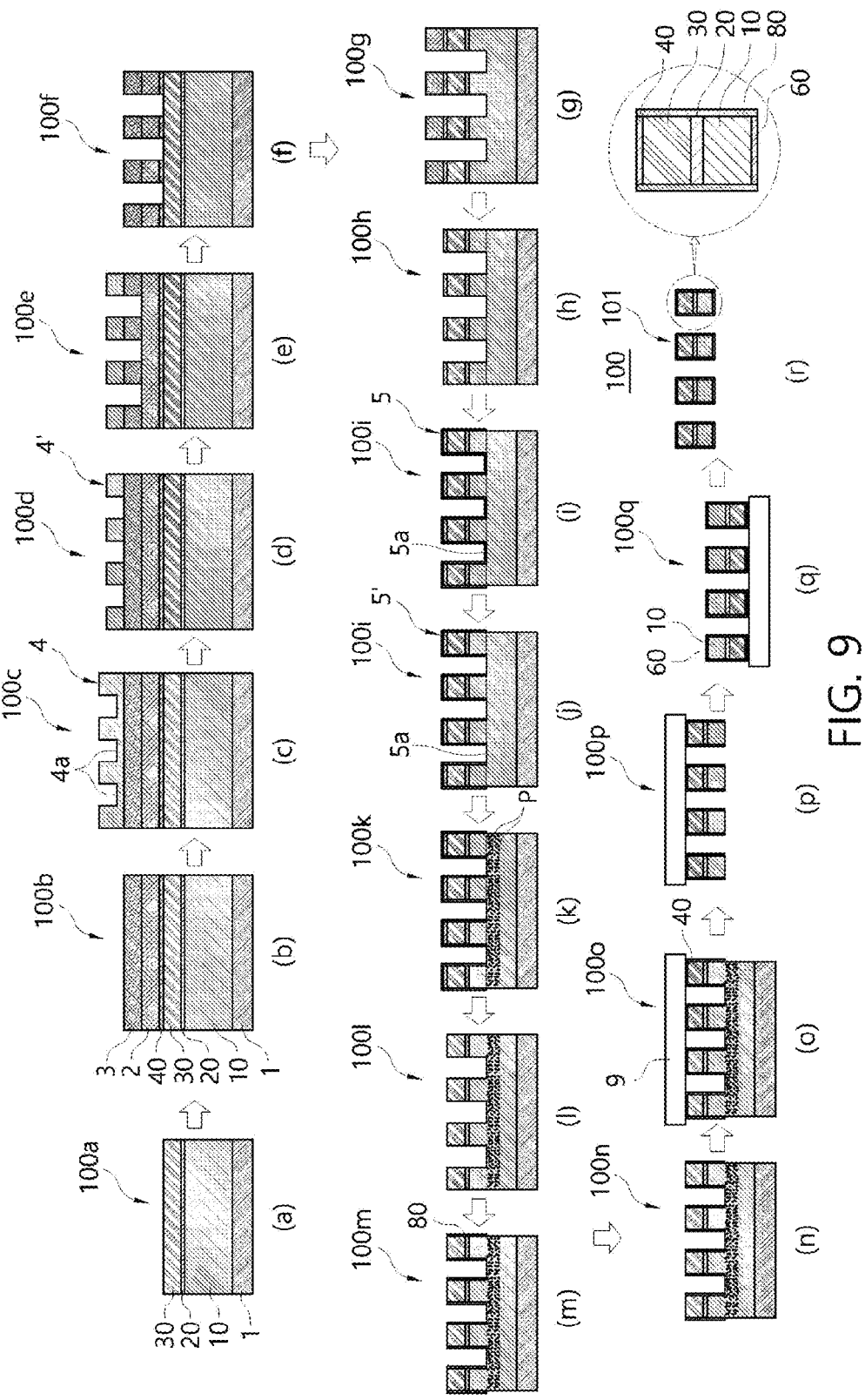
FIG. 9 and FIG. 10 show schematic views of a manufacturing method 1 of an ultra-thin LED element (first type) used in an exemplary embodiment of the present invention.
Figure 10:
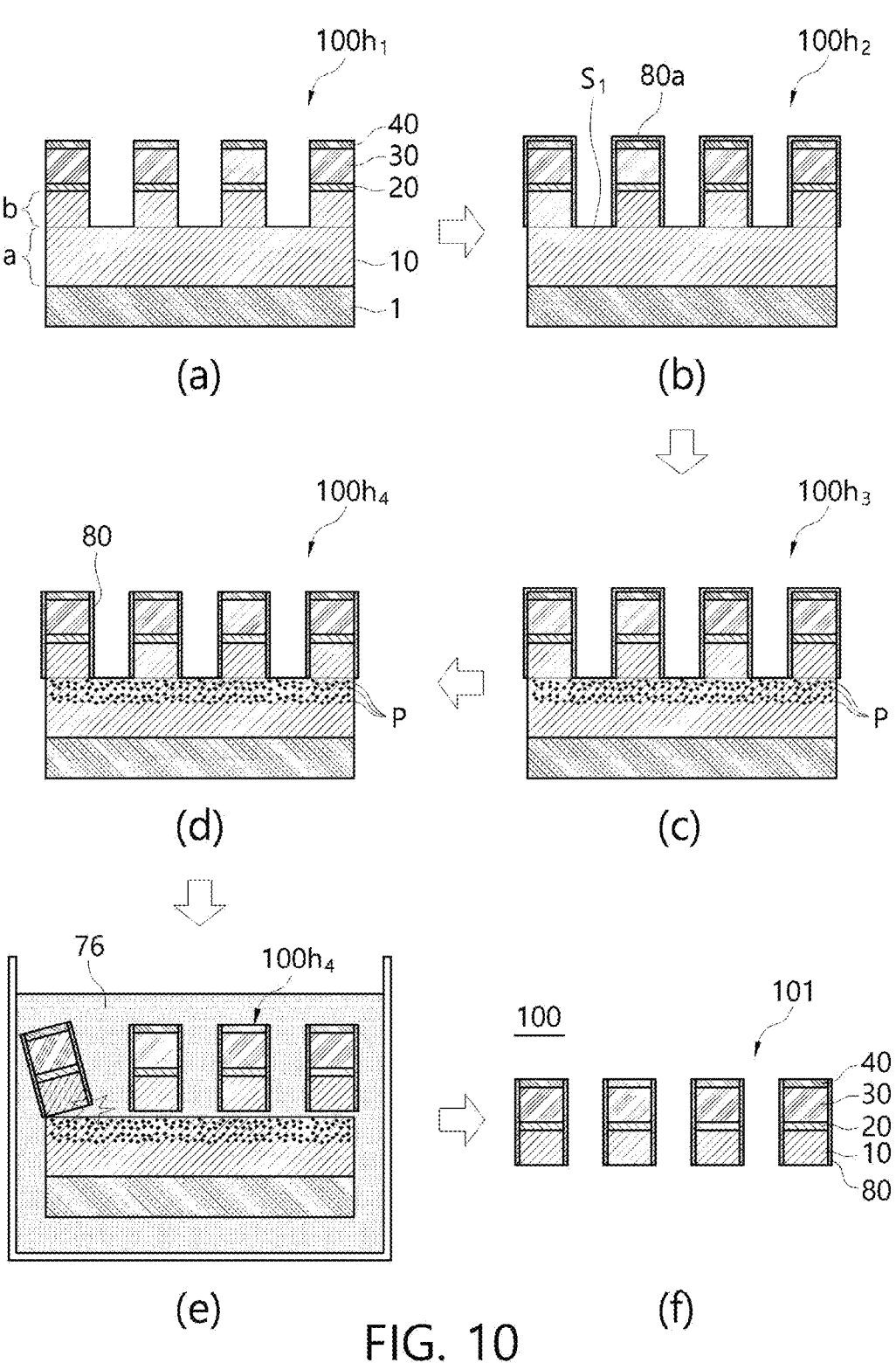
Figure 11:
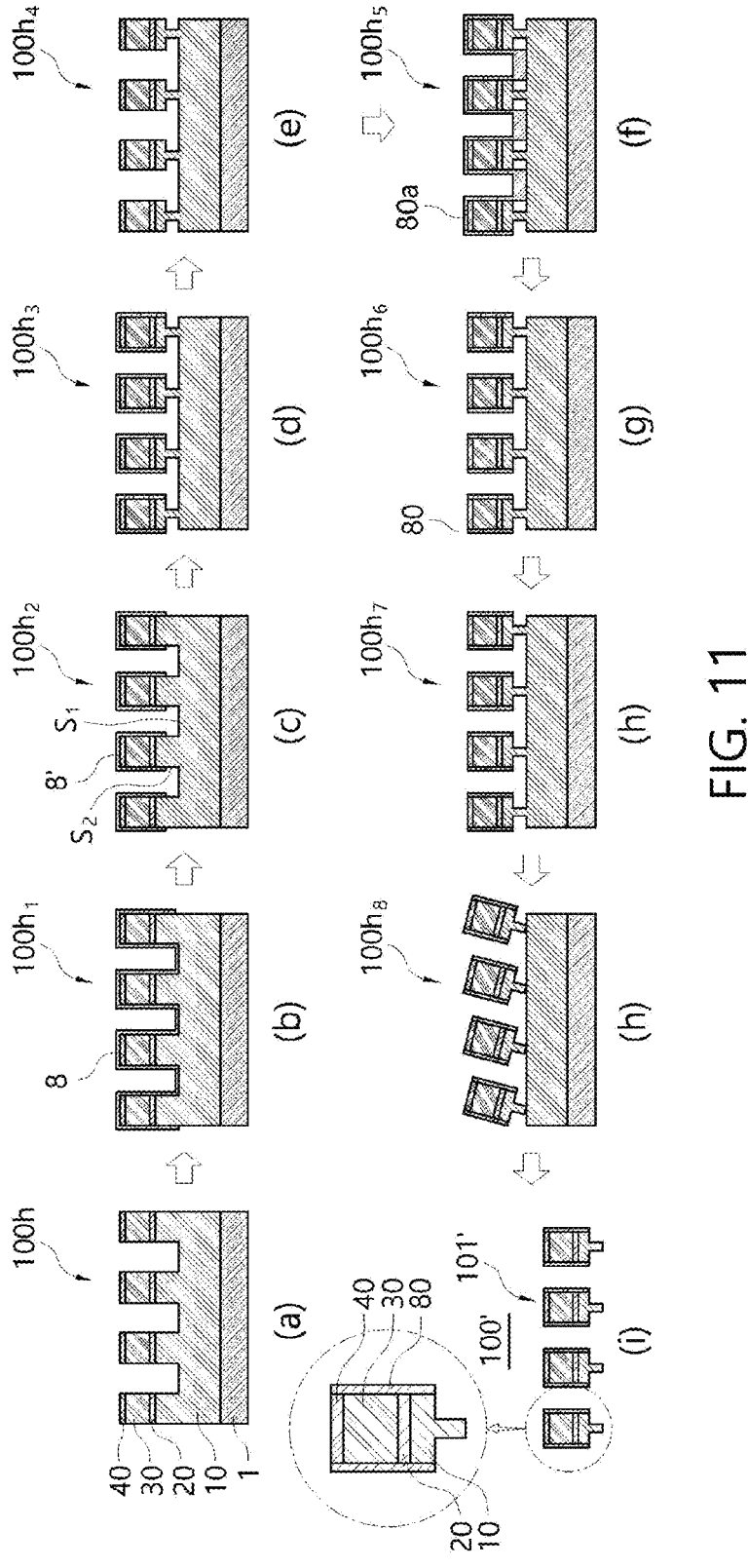
FIG. 11 shows schematic views of a manufacturing method 2 of an ultra-thin LED element (first type) used in an exemplary embodiment of the present invention.

The ultra-thin LED element 101 may be manufactured through manufacturing method 1 shown in FIGS. 9 and 10 or manufacturing method 2 shown in FIG. 11. Manufacturing method 1 may be usefully selected when an n-type III-nitride semiconductor layer is a doped n-type III-nitride semiconductor layer, and manufacturing method 2 may be useful when the n-type III-nitride semiconductor layer is not doped.

Manufacturing methods 1 and 2 are common from an operation of providing an LED wafer 100a to an operation of manufacturing a wafer including a plurality of LED structures (100h in FIG. 9 or 100h in FIG. 11) and are different in a method of separating the formed LED structures from the wafer. The operation of providing the LED wafer 100a to the operation of manufacturing the wafer including the plurality of LED structures (100h in FIG. 9 or 100h in FIG. 11) will be described through manufacturing method 1.

First, manufacturing method 1 will be described with reference to FIG. 9.

Manufacturing method 1 may include operation A of providing an LED wafer 100a (see FIG. 9A), operation B of patterning an upper portion of the LED wafer 100a such that a planar surface, which is perpendicular to a direction in which layers are stacked in an individual LED structure, has a desired shape and size (see FIGS. 9B and 9C), and then vertically performing etching down to at least a partial thickness of a conductive semiconductor layer 10 to form a plurality of LED structures (see FIG. 9D to 9H), operation C of forming a protective film to surround an exposed surface of each of the plurality of LED structures and expose an upper surface of a first portion between the adjacent LED structures to the outside (see FIGS. 9I to 9J), operation D of immersing the LED wafer in an electrolyte to then electrically connect the LED wafer to any one terminal of a power supply and electrically connect the other terminal of the power supply to an electrode immersed in the electrolyte, and then applying power to form a plurality of pores in the first portion (see FIGS. 9K and 9E), and operation E of applying ultrasonic waves to the LED wafer to separate the plurality of LED structures from the first portion in which the plurality of pores are formed (see FIG. 9O).

As the LED wafer 100a provided in operation A, a commercially available LED wafer may be used without limitation. As an example, the LED wafer 100a may include a substrate 1, a first conductive semiconductor layer 10, a photoactive layer 20, and a second conductive semiconductor layer 30. In this case, the first conductive semiconductor layer 10 may be an n-type III-nitride semiconductor layer, and the second conductive semiconductor layer 30 may be a p-type III-nitride semiconductor layer. In addition, since the LED structures remaining on the LED wafer after the n-type III-nitride semiconductor layer is etched to a desired thickness can be separated through operations C to E, a thickness of the n-type III-nitride semiconductor layer in the LED wafer is likewise not limited, and the presence or absence of a separate sacrificial layer may not be considered when a wafer is selected.

Furthermore, each layer in the LED wafer 100a may have a c-plane crystal structure.

In addition, the LED wafer 100a may have been subjected to a cleaning process, and since a typical wafer cleaning solution and cleaning process may be appropriately adopted for the cleaning process, the present invention is not particularly limited in that respect. The cleaning solution may be, for example, isopropyl alcohol, acetone, or a hydrochloric acid but is not limited thereto.

Next, before operation B is performed, an operation of forming a lower electrode layer 40 on the second conductive semiconductor layer 30 which is the p-type III-nitride semiconductor layer may be performed. The lower electrode layer 40 may be formed through a typical method of forming an electrode on a semiconductor layer, for example, through a deposition process using sputtering. A material of the lower electrode layer 40 may be, for example, ITO as described above, and the lower electrode layer 40 may be formed to have a thickness of about 150 nm. The lower electrode layer 40 may be further subjected to a rapid thermal annealing (RTA) process after the deposition process and may be processed, for example, at a temperature 600° C. for 10 minutes, but since the RTA process may be appropriately adjusted in consideration of the thickness, material, and the like of the electrode layer, the present invention is not particularly limited in that respect.

Next, in operation B, the upper portion of the LED wafer may be patterned such that the planar surface perpendicular to the direction in which the layers are stacked in each LED structure has the desired shape and size (see FIGS. 9B and 9C). Specifically, a mask pattern layer may be formed on an upper surface of the lower electrode layer 40, and the mask pattern layer may be formed using a known method and a material used for etching an LED wafer etching. A pattern of the pattern layer may be formed by appropriately applying a typical photolithography method, a nanoimprinting method, or the like.

As an example shown in FIG. 9F, the mask pattern layer may be a stack of a first mask layer 2, a second mask layer 3, and a resin pattern layer 4' of which certain patterns are formed on the lower electrode layer 40. To briefly described a method of forming the mask pattern layer, as an example, after the first mask layer 2 and the second mask layer 3 are formed on the lower electrode layer 40 through deposition, and a resin layer 4 using which the resin pattern layer 4' is formed is formed on the second mask layer 3 (see FIGS. 9B and 9C), a residual resin portion 4a of the resin layer 4 is removed through a typical method such as a reactive ion etching (RIE) method (see FIG. 9D), and then the second mask layer 3 and the first mask layer 2 are sequentially etched along a pattern of the resin pattern layer 4' (see FIGS. 9E and 9F), thereby forming the mask pattern layer. In this case, the first mask layer 2 may be made of, for example, silicon dioxide, the second mask layer 3 may be a metal layer of aluminum, nickel, or the like, and each of the first mask layer 2 and the second mask layer 3 may be etched using RIE and inductively coupled plasma (ICP). Meanwhile, when the first mask layer 2 is etched, the resin pattern layer 4' may also be removed (see 100F).

In addition, the resin layer 4 using which the resin pattern layer 4' is formed may be formed through a nanoimprinting method. After a mold corresponding to a certain desired pattern template is manufactured, a resin is processed in the mold to form the resin layer, and then the resin layer 4 is transferred to be positioned on a wafer stack 100*b* in which the first mask layer 2 and the second mask layer 3 are formed on the lower electrode layer 40 to then remove the mold, thereby implementing a wafer stack 100*c* in which the resin layer 4 is formed.

Meanwhile although a method of forming a pattern through a nanoimprinting method has been described, the present invention is not limited thereto, and a pattern may be formed through photolithography using a known photosensitive material or may be formed through known laser interference lithography, electron beam lithography, or the like.

Thereafter, as shown in FIG. 9G, along the patterns of the mask pattern layers 2 and 3 formed on the lower electrode layer 40, etching may be performed down to a partial thickness of the first conductive semiconductor layer 10, which is the n-type III-nitride semiconductor layer, in a direction perpendicular to a surface of an LED wafer 100*f* to manufacture an LED wafer 100*g* on which the LED structures are formed. In this case, the etching may be performed through a typical dry etching method such as an ICP method and a potassium hydroxide (KOH)/anisotropic tetramethylammonium hydroxide (TMAH) wet etching method. In such an etching process, the second mask layer 3 made of Al constituting the mask pattern layer may be removed, and then the first mask layer 2 made of silicon dioxide constituting the mask pattern layer present on the lower electrode layer 40 of each LED structure in the LED wafer 100*g* may be removed to manufacture an LED wafer 100*h* on which the plurality of LED structures are formed.

Next, as operation C, an operation of forming a protective film 80*a* to a certain thickness to surround the exposed surface of each of the plurality of LED structures in the LED wafer 100*h* on which the plurality of LED structures are formed and expose an upper surface S1 of a first portion a between the adjacent LED structures to the outside is performed (see FIGS. 9I to 9J). The protective film 80*a* may be for preventing damage to the LED structure due to the performing of operation D which will be described below. In addition, when the protective film 80*a* continues to remain on a side surface of the LED structure separated from the LED wafer, the protective film 80*a* may also perform a function of protecting the side surface of the individually separated LED structure from external stimuli.

When operations C to E are described with reference to FIG. 10, operation C may be performed through operation C-1 of depositing a protective film material on the LED wafer 100*h* on which the plurality of LED structures are formed and forming the protective film 80*a* to a certain thickness to surround the exposed surface of each of the plurality of LED structures, and operation C-2 of removing the protective film deposited on the upper surface $S_1$ of the first portion a between the adjacent LED structures to expose the upper surface S1 of the first portion a between the LED structures to the outside.

Operation C-1 is an operation of depositing the protective film material on the LED wafer 100*h* on which the plurality of LED structures are formed (see FIG. 10A). In this case, the protective film material may be a known material that is not chemically attacked by an electrolyte of an operation which will be described below. As an example, the above-described materials of a protective film 80 can be used without limitation. As an example, the protective film material may include at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN). In addition, the protective film 80*a* formed through deposition of the protective film material may have a thickness of 5 nm to 100 nm and more preferably a thickness of 30 nm to 100 nm. When the thickness of the protective film 80*a* is less than 5 nm, it may be difficult to prevent the LED structure from being attacked by an electrolyte in operation D which will be described below. When the thickness of the protective film 80*a* exceeds 100 nm, there may be problems in that manufacturing costs are increased and the LED structures are connected.

Next, operation C-2 is an operation of removing the protective film deposited on the upper surface S1 of the first portion a between the adjacent LED structures to expose the upper surface S1 of the first portion a between the LED structures to the outside (see FIG. 10B). Due to the performing of operation C-1, the protective film material may also be deposited on the upper surface S1 of the first portion a between the adjacent LED structures. Accordingly, an electrolyte may not come into contact with the first conductive semiconductor layer 10 that is the n-type III-nitride semiconductor, and thus desired pores may not be formed in the first portion a. Accordingly, the operation of removing the protective film material applied on the upper surface S1 of the first part a to expose the upper surface S1 to the outside is performed. In this case, the protective film material may be removed through a known dry or wet etching method in consideration of the protective film material.

Meanwhile, according to an exemplary embodiment of the present invention, the protective film 80*a* formed in operation C is a temporary protective film to prevent damage to the LED structure due to the performing of operation C. An operation of removing the temporary protective film and then forming a surface protective film surrounding the side surface of the LED structure may be further included between operations D and E. That is, as shown in FIG. 8, in operation 3, a protective film 5' may be provided only as a temporary protective film for preventing damage to the LED structure in operation 4 (see FIGS. 9I to 9K), and after the protective film 5' is removed before operation 5 is performed, the surface protective film 80 for performing a function of preventing damage to the surface of the LED structure may be formed to cover the side surface of the LED structure (see FIG. 9M).

Meanwhile, in some exemplary embodiments as shown in FIG. 9, although the protective film needs to be formed twice, the formation of the protective film may be selected in consideration of a planar shape and size of the manufactured LED structure and an interval between the LED structures. In addition, when operation D, which will be described below, is performed, the protection film may be partially attacked. When the attacked protective film is left on the finally obtained individual LED structure and is used as a surface protective film, there may be cases in which it may be difficult to properly perform a surface protection function, and thus in some cases, it may be advantageous to provide a protective film again after removing the protective film subjected to operation D.

To described the manufacturing process shown in FIG. 9, after a temporary protective film material 5 is deposited on the LED wafer 100*h* on which the plurality of LED structures are formed (see FIG. 9I), the protective film 5', which is a temporary protective film for protecting the side surfaces and upper portions of the plurality of LED structures, may be formed by etching the temporary protective film material 5 deposited on the upper surface S1 of the first portion a of the first conductive semiconductor layer 10 which is the doped n-type III-nitride semiconductor layer between the adjacent LED structures of an LED wafer 100*i* on which the protective film material 5 is deposited. Thereafter, after operation D, which will be described below, is performed (see FIG. 9K), the protective film 5' may be removed through etching (see FIG. 9I), a protective film material may be deposited on an LED wafer 100*i* as a surface protective film for protecting the surface of the LED structure, and then the protective film material formed on each of the ED structures may be removed to form the protective film 80 surrounding the side surface of the LED structure (see FIG. 9M). In this case, the protective film material formed on the upper part of the LED structure may be removed together with the protective film material deposited on the upper surface S1 of the first portion a of the first conductive semiconductor layer 10 which is the doped n-type III-nitride semiconductor layer between the adjacent LED structures of an LED wafer 100*m*. Thus, in operation 3 which will be described, a bubble-forming solvent can come into contact with the upper surface S1 of the first portion a, and bubbles generated through ultrasonic waves may penetrate into pores P formed in the first portion a, thereby separating the LED structure through the bubbles.

Meanwhile, descriptions of the temporary protective film material and the surface protective film material are the same as the descriptions of the materials of the above-described protective film. The thickness of the implemented thin film may also be implemented within the thickness range of the above-described protective film.

Next, as operation D of manufacturing method 1, an operation of immersing the LED wafer in the electrolyte to electrically connect the LED wafer to any one terminal of the power supply and electrically connect the other terminal of the power supply to the electrode immersed in the electrolyte, and then applying power to form the plurality of pores in the first portion is performed.

Specifically, referring to FIG. 10, an LED wafer 100*h2* on which the protective film 80*a* is formed may be electrically connected to any one terminal of the power supply, for example, an anode, the electrode immersed in the electrolyte may be electrically connected to the other terminal of the power supply, for example, a cathode, and then power may be applied to manufacture an LED wafer 100*h3* in which the plurality of pores P are formed in the first portion a of the first conductive semiconductor layer 10 which is the doped n-type III-nitride semiconductor. In this case, the pores P may start to be formed from the upper surface S1, which is in direct contact with the electrolyte, of the first portion a of the first conductive semiconductor layer 10, which is the doped n-type III-nitride semiconductor, and may be formed in a thickness direction and a lateral direction of a side of the first portion a corresponding to a lower portion of each of the LED structures.

The electrolyte used in operation D may include at least one oxygen acid selected from the group consisting of oxalic acid, phosphoric acid, sulfurous acid, sulfuric acid, carbonic acid, acetic acid, chlorous acid, chloric acid, bromic acid, nitrous acid, and nitric acid, and more preferably, oxalic acid may be used. Thus, there is an advantage in that damage to the first conductive semiconductor layer can be minimized. In addition, the electrode may be made of platinum (Pt), carbon (C), nickel (Ni), gold (Au), or the like and may be, for example, a platinum electrode. In addition, in operation D, a voltage of 3 V or more may be applied as power for 1 minute to 24 hours, and thus the pores P may be smoothly formed down to the side of the first portion a corresponding to the lower portion of each of the plurality of LED structures, thereby more easily separating the LED structure from the wafer through operation E. More preferably, the voltage may be 5 V or more, and more preferably, a voltage of 30 V or less may be applied.

When a voltage of less than 3 V is applied, even if an application time of power is increased, the pores are not smoothly formed in the side of the first portion a corresponding to the lower portion of each LED structure, and thus it is difficult to separate the LED structure through operation E which will be described below, or even if the LED structure is separated, shapes of separated cross sections of the plurality of LED structures may be different, and thus it may be difficult for the plurality of LED structures to exhibit uniform characteristics. In addition, when a voltage exceeding 30 V is applied, the pores may be formed down to a second portion b which is a lower end portion of the LED structure and continues to the first portion a of the doped n-type III-nitride semiconductor layer, thereby causing degradation in light emitting characteristic. In addition, in operation E which will be described below, it is preferable that the LED structure is separated at a boundary point between the second portion b and the first portion a of the doped n-type III-nitride semiconductor layer. However, due to the pores formed in a side of the second portion b, separation may occur at any point of the side of the second portion b beyond the boundary point, and thus there is a risk that an LED structure, which has an n-type semiconductor layer that is thinner than an initially designed n-type semiconductor layer, may be obtained. In addition, similarly to an effect according to a magnitude of a voltage, when an application time of power is also increased, there is a risk that pores may be formed down to the second portion b other than an intended portion, and on the other hand, when the application time is decreased, pores may not be smoothly formed, and thus it may be difficult to separate the LED structure.

After operation D and before operation E which will be described below, in order to enable electrical connection to a side of the lower electrode layer 40 after the LED structure is separated from the wafer, an operation of manufacturing an LED wafer 100*h4*, from which a protective film of the protective film 80*a* formed on an upper surface of each LED structure is removed may be further performed. In addition, since only the protective film formed on the upper surface of the LED structure is removed, the protective film 80 formed on the side surface of the LED structure may remain and thus may perform a function of protecting the side surface of the LED structure from the outside.

In addition, after operation D and before operation E which will be described below, an operation of forming another layer on the lower electrode layer 40 of the LED structure may be further performed, and another layer may be, for example, a Ti/Au composite layer which may be further formed using a lower electrode layer material on the lower electrode layer 40 which is an ITO layer (see FIG. 9N).

Next, as operation E according to manufacturing method 1, an operation of applying ultrasonic waves to the LED wafer 100*h*$_4$ to separate the plurality of LED structures from the first portion a in which the plurality of pores P are formed is performed. In this case, ultrasonic waves may be directly applied to the LED wafer 100*h*$_4$ in which the pores are formed or indirectly applied by immersing the LED wafer 100*h*$_4$, in which the pores are formed, in a solvent. However, in a method of collapsing the pores P of the first portion a using a physical external force caused by the ultrasonic wave itself, the collapse of the pores is not smooth, and when the pores are excessively formed to facilitate the collapse, there is a risk of pores being formed up to the second portion b of the LED structure, which may cause a side effect of lowering the quality of the LED structure.

Thus, according to an exemplary embodiment of the present invention, operation E may be performed using a sonochemistry method. Specifically, after the LED wafer $100h_4$ is immersed in a bubble-forming solution 76 (or solvent), ultrasonic waves are applied to the bubble-forming solution 76 (or solvent) to collapse bubbles through energy generated when generated and grown bubbles burst in the pores by a sonochemical mechanism, thereby separating the plurality of LED structures. In detail, ultrasonic waves alternately generate a relatively high pressure part and a relatively low pressure part in a travel direction of sound waves, and generated bubbles pass through the high pressure part and the low pressure part to repeatedly compress and expand and grow into bubbles with a higher temperature and pressure and then collapse. The bubble becomes a local hot spot that generates a high temperature of 4,000K level and a high pressure of an atmospheric pressure level of 1,000, and pores generated in the LED wafer are collapsed using such energy, thereby separating the LED structure from the wafer. After all, ultrasonic waves generate and grow bubbles in the bubble-forming solution (or solvent) and perform only a function of moving and penetrating the generated bubbles into the pores P of the first portion a. Then, through a pore collapse mechanism in which the pores P are collapsed by an external force generated when bubbles, which penetrate into the pores P and are in an unstable state with a high temperature and pressure, burst, the plurality of LED structures can be easily separated from the ED wafer, thereby obtaining an LED assembly 100' including a plurality of ultra-thin LED elements 101'.

As the bubble-forming solution 76 (or solvent), a solution (or solvent), which can generate bubbles when ultrasonic waves are applied and can be grown to have high pressure and temperature, may be used without limitation. Preferably, a bubble-forming solution (or solvent) with a vapor pressure of 100 mmHg (20° C.) or less, as another example, a vapor pressure of 80 mmHg (20° C.) or less, 60 mmHg or less (20° C.), 50 mmHg or less (20° C.), 40 mmHg or less (20° C.), 30 mmHg or less (20° C.) or less, 20 mmHg or less (20° C.), or 10 mmHg or less (20° C.) or less, may be used. When a solvent having a vapor pressure exceeding 100 mmHg (20° C.) is used, separation may not occur properly within a short time, and thus there may be a risk of a manufacturing time increasing, and production costs increasing. The bubble-forming solution 76 satisfying such physical properties may be, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, 20° C., may be used as the bubble-forming solution (or solvent), but by adjusting conditions for performing operation E, a vapor pressure of the bubble-forming solution (or solvent) may be adjusted to 100 mmHg or less in the conditions (for example, a low temperature condition) to perform operation E. In this case, a limitation on types of usable solvents may become wider, and as an example, a solvent such as water, acetone, chloroform, or alcohol may be used.

In addition, a wavelength of ultrasonic waves applied in operation E may be applied at a frequency at which, when the bubbles are collapsed, the bubbles can be grown and collapsed to become regions that can cause sonochemistry, specifically, local hot spots that generate high pressure and temperature. As an example, the wavelength may be in a range of 20 kHz to 2 MHz, and an application time of the applied ultrasonic waves may be in a range of 1 minute to 24 hours, thereby making it easy to separate the LED structure from the LED wafer. Even if the wavelength of the applied ultrasonic waves falls within this range, when an intensity thereof is low or the application time is short, there is a risk of LED structures not separated from the LED wafer being present, or the number of LED structures not separated from the LED wafer increasing. In addition, when the intensity of the applied ultrasonic waves is high or the application time is long, there is a risk of damage to the LED structure.

In each of the plurality of LED structures separated through the formation of pores in operation D and the application of ultrasonic waves in operation E, pores may be formed in a portion of the first conductive semiconductor layer (n-type conductive semiconductor layer).

Meanwhile, before operation E is performed, in order to form an upper electrode layer 60 on the first conductive semiconductor layer 10, that is, in order to form another layer, for example, the upper electrode layer 60 or an electron delay layer (not shown) on the first conductive semiconductor layer 10, an operation of attaching a support film 9 onto an LED wafer 100n (see FIG. 9O) may be further performed, and then operation E may be performed to separate the plurality of LED structures in a state in which the support film 9 is attached (see FIG. 9P). After that, the upper electrode layer 60 may be formed on the plurality of LED structures through a known method such as a deposition method in a state in which the support film 9 is attached (see FIG. 9Q), and then when the support film is removed, an aggregate 100 of a plurality of ultra-thin LED elements 101 may be obtained.

In this case, by using the above-described donor film instead of the support film 9, the upper electrode layer 60 may be formed on the plurality of LED structures attached onto the donor film through a known method such as a deposition method, thereby being applied as a transfer film for manufacturing an ultra-thin LED electrode assembly using the above-described laser-assisted multi-chip transfer printing method of the present invention. In this case, an operation of separating the ultra-thin LED element from the support film or the donor film (see FIG. 9R) is not performed. As described above, the donor film may include a polydimethylsiloxane stamp (PDMS) film, a polyimide film including a dynamic release layer, an elastomeric micro-structure stamp film, or a shape memory polymer film.

Next, a method of manufacturing an ultra-thin LED element through manufacturing method 2 will be described with reference to FIG. 11.

As described above, forming an LED wafer 100h on which a plurality of LED structures are formed from an LED wafer is the same as in manufacturing Method 1. Thereafter, manufacturing method 2 may be performed through operation i of forming an insulating film 8 to cover exposed side surfaces of the plurality of LED structures in the LED wafer 100h on which the plurality of LED structures are formed (see FIG. 11B), operation ii of removing a portion of an insulating film formed on a first conductive semiconductor layer 10 to expose an upper surface S1 of the first conductive semiconductor layer 10 between the adjacent LED structures (FIG. 11C), operation iii of further etching the first conductive semiconductor layer 10 in a thickness direction thereof through the exposed upper surface S1 of the first conductive semiconductor layer and forming a portion of the first conductive semiconductor layer of which a side surface is exposed by as much as a certain thickness in a downward direction of the first conductive semiconductor layer of an LED pillar on which an insulating film 8' is formed (see FIG. 11C), operation iv of etching the portion of the first conductive semiconductor layer, of which the side surface is exposed, from both side surfaces thereof toward a center thereof (see FIG. 11D), operation v of removing the insulating film 8 (see FIG. 11E), operation vi of forming a protective film 80 on the side surfaces of the plurality of LED structures (FIG. 11F), operation vii of removing the protective film formed on the plurality of LED structures to expose a lower electrode layer 40 (see FIG. 11G), operation viii of forming an arrangement guide layer 70 on the lower electrode layer 40 (see FIG. 11H), and operation ix of separating the plurality of LED structures from the LED wafer to manufacture an ultra-thin LED aggregate 100" including a plurality of ultra-thin LED elements 100". Meanwhile, manufacturing method 2 described above may be performed by appropriately using a known method of manufacturing an LED element, for detailed description thereof, application No. 2020-0050884 by the inventor of the present invention is herein incorporated by reference in its entirety, and in the present invention, detailed description of each operation of manufacturing method 2 is omitted.

In this case, the separation of the plurality of LED structures in operation ix may be performed through cutting using a cutting mechanism or detachment using an adhesive film.

In addition, although not shown in the drawing, after operation vii of removing the protective film formed on the plurality of LED structures to expose the lower electrode layer 40 (see FIG. 11G) is performed, as shown in FIG. 9O, an operation of attaching a donor film onto the lower electrode layer of the plurality of LED structures, and then the plurality of LED structures are separated from the LED wafer so that the donor film may be applied as a transfer film for manufacturing an ultra-thin LED electrode assembly using the above-described laser-assisted multi-chip transfer printing method of the present invention.

In addition, after operation vii and operation viii of forming the arrangement guide layer 70 on the lower electrode layer 40 are performed, as shown in FIG. 9O, an operation of attaching the donor film onto the plurality of LED structures is performed, and then the plurality of LED structures are separated from the LED wafer so that the donor film may be applied as a transfer film for manufacturing an ultra-thin LED electrode assembly using the above-described laser-assisted multi-chip transfer printing method of the present invention.

As described above, the donor film may include a PDMS film, a polyimide film including a dynamic release layer, an elastomeric microstructure stamp film, or a shape memory polymer film.

Figure 12:
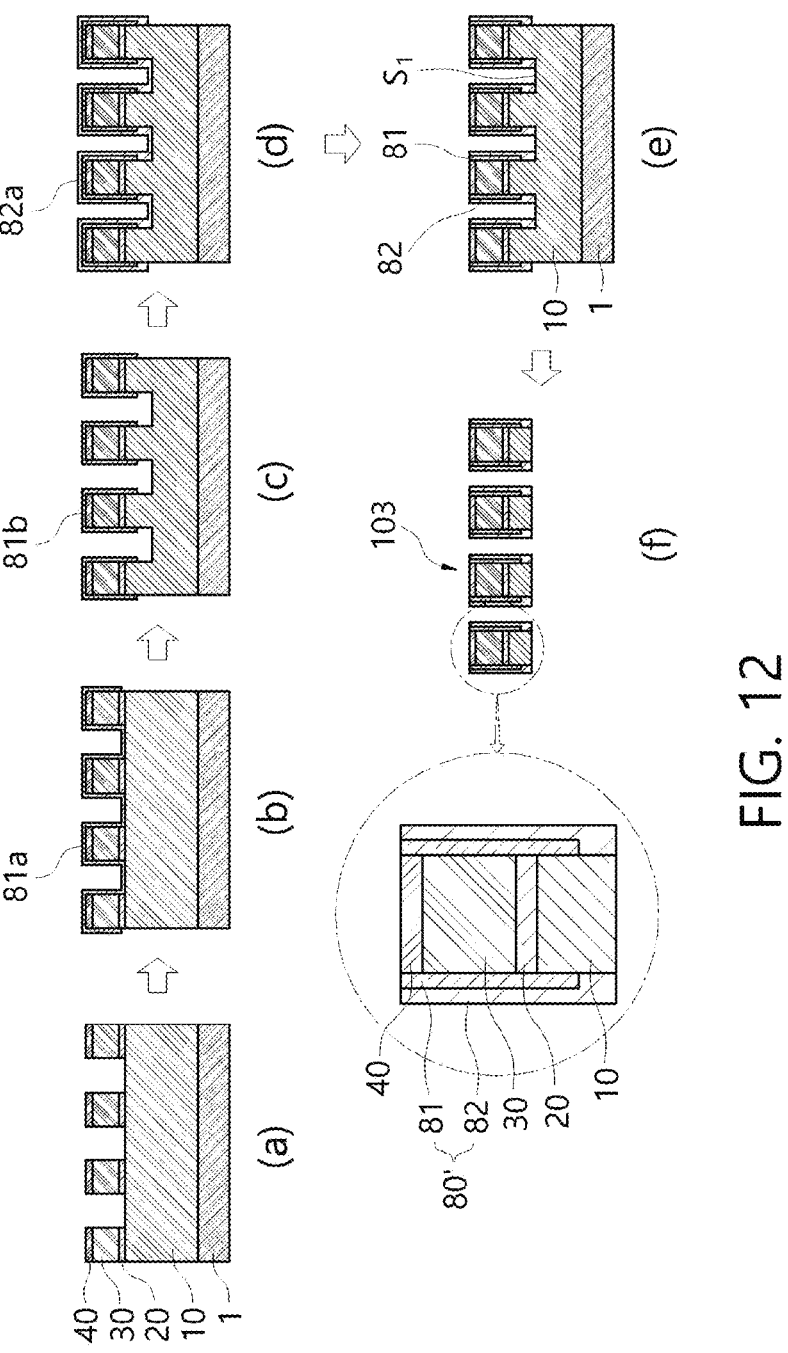
FIG. 12 is shows schematic views of a manufacturing method of an ultra-thin LED element (first type) used in an exemplary embodiment of the present invention.

Meanwhile, as described above with reference to FIG. 8, as a protective film, a protective film 80' including a hole pushing film 81 and an electron pushing film 82 for improving luminous efficiency may be formed, and a manufacturing method thereof will be described with reference to FIG. 12.

A difference from the description with reference with FIGS. 9 to 11 is that, when etching is vertically performed, a portion of a first conductive semiconductor layer 10 which is an n-type semiconductor is not etched, the etching is primarily performed only down to a second conductive semiconductor layer 30, a portion of a photoactive layer 20, or the photoactive layer 20 (see FIG. 12A), then etching is secondarily performed down to a partial thickness of the first conductive semiconductor layer 10 (see FIG. 12C), and a process of depositing a film material and removing the film material between a plurality of LED structures is performed twice (FIGS. 12B, 12D, and 12E).

Specifically, when an LED wafer is vertically etched, a portion of the first conductive semiconductor layer 10 which is the n-type semiconductor is not etched, the LED wafer is primarily etched only down to the second conductive semiconductor layer 30, the second conductive semiconductor layer 30 and a portion of the photoactive layer 20, or the photoactive layer 20 (see FIG. 12A), and then, after a hole pushing film material 81a is deposited (see FIG. 12B), a process of removing the hole pushing film material formed between the LED structures is performed. Thereafter, the LED wafer may be secondarily etched again to a certain thickness of the first conductive semiconductor layer 10 (FIG. 12C), an electron pushing film material 82a may be deposited on the LED structure on which a hole pushing film 81b is formed (see FIG. 12D), and then a process of removing the electron pushing film material formed in a space S1 between the LED structures (see FIG. 12E) may be performed. Thereafter, a process of separating the LED structure in FIGS. 9 to 11 (FIG. 9K et seq. and FIG. 10D et seq.) or a process of separating the LED structure in FIG. 11 (FIG. 11D et seq.) may be performed to separate an ultra-thin LED element 103 from the LED wafer.

In addition, as described above, in the description of FIG. 12, a transfer film may be used and applied in manufacturing a donor film.

Thereafter, an operation of fixing ultra-thin LED elements 104, 105, and 106, which are erected and disposed on lower electrodes 311 and 312, and bringing the ultra-thin LED elements 104, 105, and 106 into ohmic contact with the lower electrodes 311 and 312 may be further performed. The fixing and ohmic contact may be performed, for example, through an RTA process on an interface between the lower electrode and the ultra-thin LED element. Alternatively, a fixing layer having a low melting point is further provided in an arrangement region on the lower electrodes 311 and 312, the ultra-thin LED elements 104, 105, and 106 may be erected and disposed in the arrangement region, and then heat may be applied to melt and solidify the fixing layer, thereby firmly fixing the ultra-thin LED elements 104, 105, and 106 onto the lower electrodes 311 and 312. The fixing layer may be made of, for example, a typical solder material used as an electrical and electronic material.

Next, an exemplary embodiment of a micro-nanofin ultra-thin LED electrode element and an LED electrode assembly using the same will be described.

[Second (Micro-Nanofin) Type Ultra-Thin LED Electrode Element and LED Electrode Assembly]

Figure 13A:
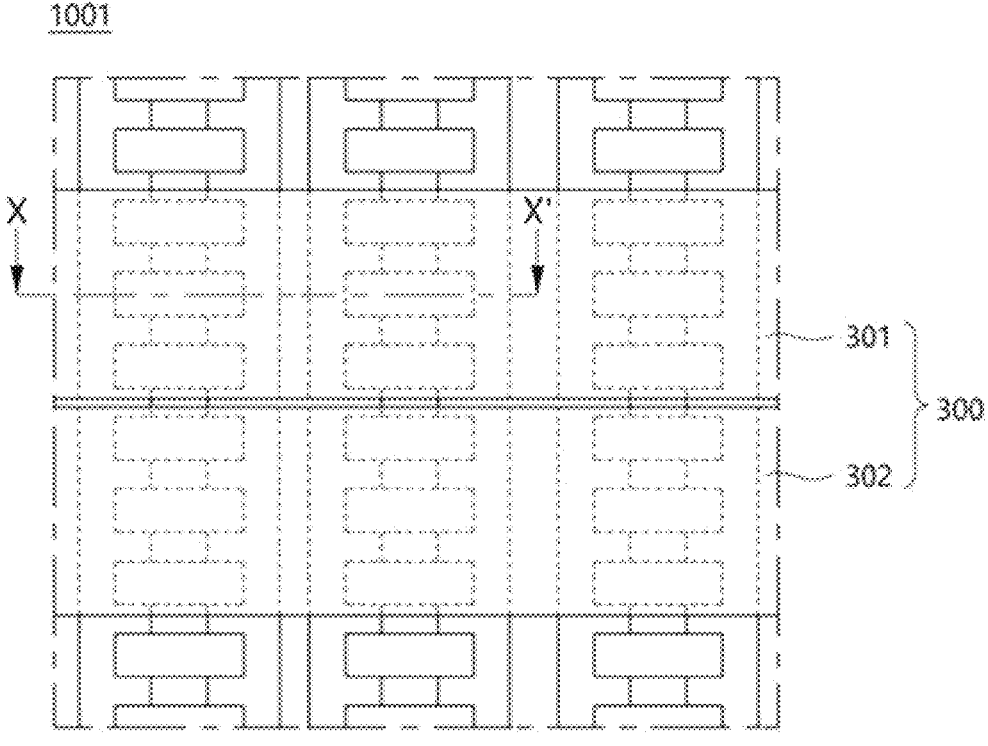
FIG. 13A is a view of a micro-nanofin LED electrode assembly according to an exemplary embodiment of the present invention.

A subpixel unit in an LED electrode assembly manufactured using second type ultra-thin LED elements will be described with reference to FIGS. 13A and 13B below. A blank portion in FIG. 13 indicates one pixel unit in the LED electrode assembly, and the pixel unit is illustrated in a schematic view as including three subpixel units (first to third subpixel units) which each include six micro-nanofin LED elements.

A micro-nanofin LED electrode assembly 1001 according to an exemplary embodiment of the present invention includes a lower electrode line 200 including a plurality of electrodes 211, 212, 213, and 214 spaced a certain interval from each other in a horizontal direction, a plurality of micro-nanofin LED elements 107 disposed on the lower electrode line 200, and an upper electrode line 300 disposed in contact with upper portions of the micro-nanofin LED elements 107.

First, prior to a detailed description of each component, electrode lines for allowing the micro-nanofin LED elements to be self-aligned and emit light will be described.

The micro-nanofin LED electrode assembly 1001 includes the upper electrode line 300 and the lower electrode line 200 disposed at an upper side and a lower side to face each other with the micro-nanofin LED elements 107 interposed therebetween. Since the upper electrode line 300 and the lower electrode line 200 are not arranged in the horizontal direction, an electrode design may be highly simplified and more easily implemented by breaking away from a complicated electrode line of a conventional electrode assembly using electric field induction, in which two types of electrodes implemented to have an ultra-thin thickness and width are arranged at micro or nano unit intervals within a planar surface with a limited area in the horizontal direction.

In detail, even in a conventional electrode assembly implemented by self-aligning elements through electric field induction, by using electrodes spaced from each other in the horizontal direction as assembly electrodes, rod-type ultra-small LED elements are mounted on the assembly electrodes, and the same electrode, that is, the assembly electrode, is used as a driving electrode without any change. However, since the lower electrode line 200 provided in an exemplary embodiment of the present invention functions as an assembly electrode, but only a surface at a side of a first conductive semiconductor layer or a surface at a side of a second conductive semiconductor layer is in contact with the lower electrode line 200, the micro-nanofin LED electrode assembly 1001 is different from the conventional electrode assembly through electric field induction in that the micro-nanofin LED element 107 cannot emit light only with the lower electrode line 200. Such a difference causes significant differences in degree of freedom of an electrode design and in easiness of the electrode design.

That is, when an assembly electrode and a driving electrode are used as the same electrode, since it is necessary to implement a structure in which rod-type ultra-small LED elements can be mounted in as many numbers as possible on a planar surface having a limited area and simultaneously to implement electrodes, to which different voltages are applied, at intervals of a micro/nano size, it has not been easy to design or implement an electrode structure.

However, since the same type of power (for example, positive or negative power) is applied to the lower electrode line 200 included in the present invention during driving, there is little risk of an electric short circuit between the lower electrodes 211, 212, 213, and 214 in the lower electrode line 200.

In addition, conventionally, both end portions of each rod-type ultra-small LED element had to be in contact with adjacent electrodes in a one-to-one correspondence for light to be emitted without an electrical short circuit. Therefore, when an individual rod-type ultra-small LED element is disposed over three or four adjacent electrodes, a photoactive layer of the rod-type ultra-small LED element is inevitably in contact with the electrode, and thus a short circuit occurs, resulting in difficulty in designing the electrode in consideration of preventing the short circuit. However, in the micro-nanofin LED element 107 included in the present invention, since the surface at the side of the first conductive semiconductor layer or the surface at the side of the second conductive semiconductor layer is in contact with the lower electrode line, and thus an electrical short circuit does not occur even when the micro-nanofin LED element 107 is disposed over the plurality of adjacent lower electrodes 211, 212, 213, and 214, which has an advantage in that the lower electrode line 200 can be more easily designed.

Figure 13B:
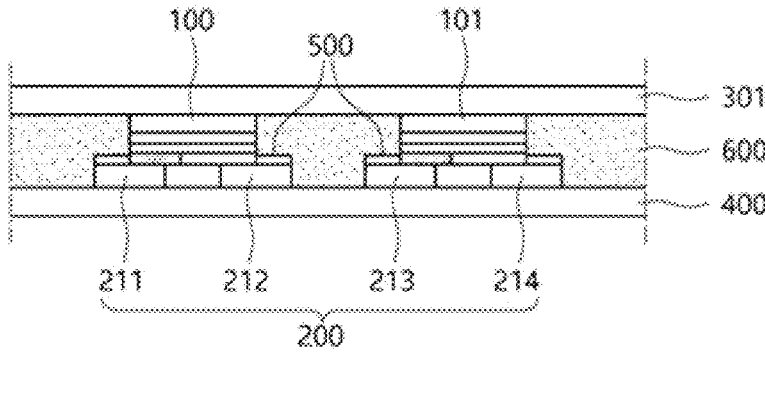
FIG. 13B is a cross-sectional view along boundary line X-X'.

In addition, since the upper electrode line 300 is disposed only to be in electrical contact with an upper surface of the micro-nanofin LED element 107 as shown in FIG. 13, there is an advantage in that an electrode is very easily designed or implemented. In particular, although FIG. 13B illustrates that the upper electrode line 300 is implemented to be divided into a first upper electrode 301 and a second upper electrode 302, only one electrode can also be implemented to be in contact with the upper surfaces of all the disposed micro-nanofin LED elements, and thus there is an advantage in that an electrode can be implemented to be highly simplified as compared with a related art.

The lower electrode line 200 serves as one of an assembly electrode for self-aligning the micro-nanofin LED element 107 such that the upper surface or a lower surface of the micro-nanofin LED element 107 in a thickness direction thereof is in contact therewith and a driving electrode provided to allow, together with the upper electrode line 300 which will be described below, the micro-nanofin LED element 107 to emit light.

In addition, the lower electrode line 200 is implemented to include the plurality of lower electrodes 211, 212, 213, and 214 spaced a certain interval from each other in the horizontal direction. The number and interval of the lower electrodes 211, 212, 213, and 214 may be the number and interval of the electrodes 211, 212, 213, and 214 which are appropriately set in consideration of a function as an assembly electrode, a length of an element, and the like.

In addition, as long as the plurality of lower electrodes 211, 212, 213, and 214 included in the lower electrode line 200 are disposed apart from each other in the horizontal direction, there is no limitation on a specific electrode arrangement. As an example, the lower electrode line 200 may have a structure in which a plurality of electrodes are spaced a certain interval from each other in one direction and disposed in parallel.

Meanwhile, an interval between the adjacent electrodes 211 and 212 may be shorter than a length of a micro-nanofin LED element 100 or 107, when the interval between two adjacent electrodes is longer than or equal to the length of the micro-nanofin LED element, the micro-nanofin LED element may be self-aligned in a form in which it is sandwiched between the two adjacent electrodes. This is not preferable because there is a high risk of an electrical short circuit occurring due to contact between a side surface of the electrode and the photoactive layer exposed at a side surface of the micro-nanofin LED element.

In addition, when the upper electrode line 300 is designed to be in electrical contact with the upper portion of the micro-nanofin LED element 107 mounted on the lower electrode line 200, there is no limitation on the number, arrangement, or the like thereof. However, when the lower electrode lines 200 are arranged in parallel in one direction as shown in FIG. 13B, the upper electrode line 300 may be arranged to be perpendicular to the one direction, and such an electrode arrangement is an electrode arrangement widely used in a conventional display field and has an advantage in that an electrode arrangement and control technology of the conventional display field can be used without any change.

Meanwhile, although FIG. 13 illustrates only the first upper electrode 301 and the second upper electrode 302 so that the upper electrode line 300 including the first upper electrode 301 and the second upper electrode 302 covers only some elements, other upper electrodes are omitted for ease of description, and there are further unillustrated upper electrodes disposed on the micro-nanofin LED element.

Since the lower electrode line 200 and the upper electrode line 300 may have a material, shape, width, and thickness of an electrode used in a typical LED electrode assembly and may be manufactured using a known method, the present invention is not specifically limited in that respect. As an example, the electrodes may be made of aluminum, chromium, gold, silver, copper, graphene, ITO, or an alloy thereof and may have a width of 0.1 μm to 50 μm and a thickness of 0.1 μm to 100 μm but may be appropriately changed in consideration of the size or the like of a desired LED electrode assembly.

Next, the micro-nanofin LED element 107 disposed between the lower electrode line 200 and the upper electrode line 300 described above will be described.

Figure 14:
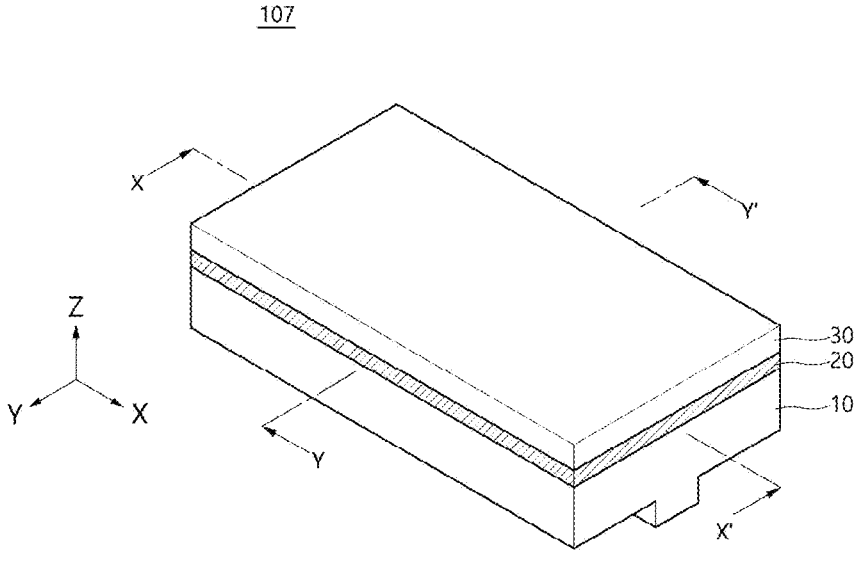
FIG. 14, FIG. 15, and FIG. 16 are a perspective view of a micro-nanofin LED element included in an exemplary embodiment of the present invention, a cross-sectional view along boundary line X-X' of FIG. 14, and a cross-sectional view along boundary line Y-Y' of FIG. 14.
Figure 15:
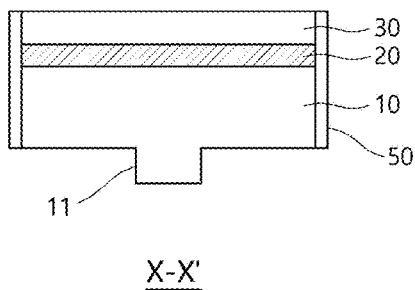
Figure 16:
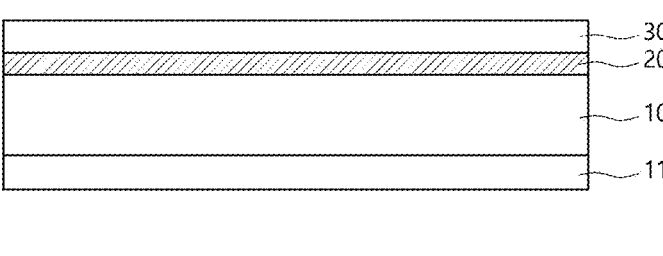

Referring to FIGS. 14 to 16, when it is assumed that, with respect to X, Y, and Z axes that are perpendicular to each other, an X-axis direction indicates a length, a Y-axis direction indicates a width, and a Z-axis direction indicates a thickness, the micro-nanofin LED element 107 according to an exemplary embodiment of the present invention may be a rod-type element in which a length corresponds to a long axis, a thickness corresponds to a short axis, and the length is greater than the thickness and may also be an element in which a first conductive semiconductor layer 10, a photoactive layer 20, and a second conductive semiconductor layer 30 are sequentially stacked in a thickness direction thereof.

More specifically, the micro-nanofin LED element 107 has a certain shape in an X-Y plane having a length and a width, a direction perpendicular to the plane is the thickness direction, and each layer is stacked in the thickness direction. Even when the photoactive layer 20 at a portion exposed at a side surface of the micro-nanofin LED element is thin, the micro-nanofin LED element has an advantage in that a wider light emitting area can be secured due to a planar surface having a length and a width. In addition, the micro-nanofin LED element 100 according to an exemplary embodiment of the present invention may thus have a wide light emitting area exceeding twice an area of a longitudinal cross section of the micro-nanofin LED element. Here, the longitudinal cross section is a cross section parallel to the X-axis direction that is a length direction, and in the case of an element having a constant width, the longitudinal cross section may correspond to the X-Y plane.

Figure 17A:
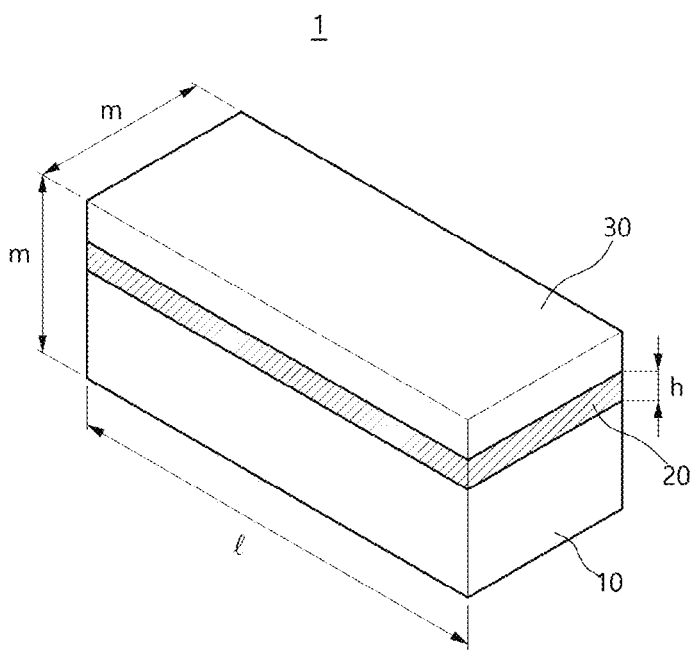
FIG. 17A and FIG. 17B are schematic views of a first rod-type element in which a first conductive semiconductor layer, a photoactive layer, and a second conductive semiconductor layer are stacked in a thickness direction thereof and a schematic view of a second rod-type element in which a first conductive semiconductor layer, a photoactive layer, and a second conductive semiconductor layer are stacked in a length direction thereof.
Figure 17B:
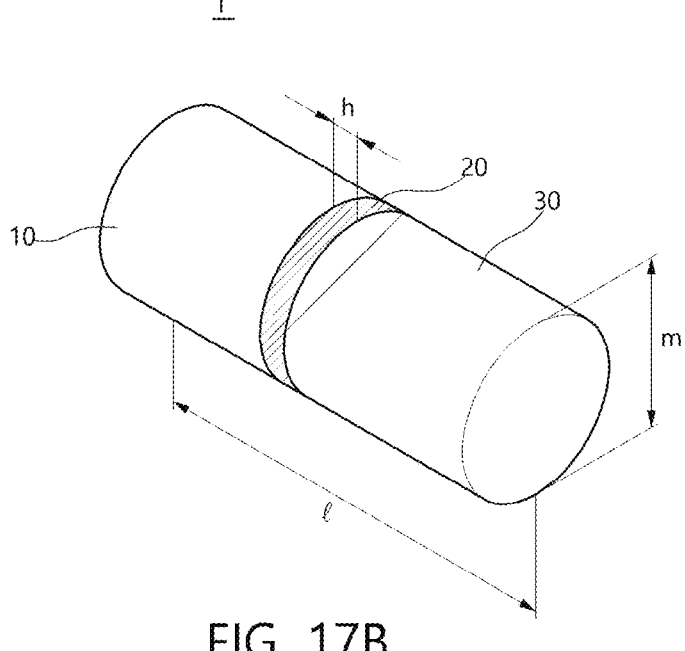

Specifically, referring to FIGS. 17A and 17B, both of a first rod-type element 1 shown in FIG. 17A and a second rod-type element 1' shown in FIG. 17B are rod-type elements which have a structure in which a first conductive semiconductor layer 10, a photoactive layer 20, and a second conductive semiconductor layer 30 are stacked, which have the same length t and the same thickness m, and of which the photoactive layers also have the same thickness h. However, there is a structural difference in that, in the first rod-type element 1, the first conductive semiconductor layer 10, the photoactive layer 20, and the second conductive semiconductor layer 30 are stacked in a thickness direction thereof, and in the second rod-type element 1', the first conductive semiconductor layer 10, the photoactive layer 20, and the second conductive semiconductor layer 30 are stacked in a length direction thereof.

However, the two elements 1 and 1' have a significant difference in light emitting area. As an example, when it is assumed that the length t is 4,500 nm, the thickness m is 600 nm, and the thickness h of the photoactive layer 20 is 100 nm, a ratio of a surface area of the photoactive layer 20 of the first rod-type element 1 and a surface area of the photoactive layer 20 of the second rod-type element 1' is 6.42 μm2:0.75 μm2, and thus a light emitting area of the first rod-type LED element 1 is about 8.56 times greater, wherein the surface area corresponds to the light emitting area. In addition, the first rod-type element 1 is similar to the second rod-shaped element 1' in a ratio of a surface area of the photoactive layer 20 exposed to the outside to a total light emitting area of the photoactive layer. However, since the absolute value of an increased unexposed surface area of the photoactive layer 20 is increased much to greatly reduce an influence of the exposed surface area on excitons, an influence of surface defects of the first rod-type LED element 1 on excitons is greatly decreased as compared with the horizontally arranged rod-type element 1'. Thus, it can be evaluated that the first rod-type LED element 1 is considerably superior to the horizontally arranged rod-type element 1' in terms of luminous efficiency and brightness. Also, the second rod-type element 1' is implemented by etching a wafer in which a conductive semiconductor layer and a photoactive layer are stacked in a thickness direction thereof. After all, a long element length corresponds to a wafer thickness, and in order to increase the element length, an increase in etch depth is inevitable. As the etch depth is increased, a possibility of occurrence of surface defects of an element increases. As a result, the second rod-type element 1' has a higher possibility of occurrence of surface defects even though an area of the exposed photoactive layer is smaller than that of the first rod-typed element 1. Therefore, considering a decrease in luminous efficiency due to an increase in possibility of occurrence of surface defects, the first rod-type element 1 may be considerably superior in luminous efficiency and brightness.

Furthermore, a movement distance of holes injected from any one of the first conductive semiconductor layer 10 and the second conductive semiconductor layer 30 and electrons injected from the other in the first rod-type element 1 is shorter than that of the second rod-type element 1', and thus a probability of electrons and/or holes being captured by defects on a wall during movement of electrons and/or holes is low. Therefore, an emission loss can be minimized, and it can also be advantageous in minimizing an emission loss due to an electron-hole velocity imbalance. In addition, in the case of the second rod-type element 1', since a strong optical path behavior occurs due to a circular rod-type structure, a path of light generated by electron-hole pairs resonates in a length direction thereof, and thus light is emitted from both end portions thereof in the length direction. Therefore, when the element is disposed to lie down, front luminous efficiency is not good due to a strong side emission profile. On the other hand, in the case of the first rod-type element 1, since light is emitted from an upper surface and a lower surface thereof, there is an advantage in that excellent front luminous efficiency is exhibited.

In the micro-nanofin LED element 107 of the present invention, like the first rod-type element 1 described above, the conductive semiconductor layers 10 and 30 and the photoactive layer 20 are stacked in the thickness direction, and the length is implemented to be longer than the thickness, thereby further increasing a light emitting area. At the same time, since the micro-nanofin LED element 107 is a rod type in which, even when an area of the exposed photoactive layer 20 is slightly increased, a thickness is shorter than a length, an etched depth is shallow, and thus a possibility of occurrence of defects on an exposed surface of the photoactive layer 20 can be reduced, which is advantageous in minimizing or preventing a decrease in luminous efficiency due to defects.

Although a planar surface is illustrated in FIG. 14 as having a rectangular shape, the present invention is not limited thereto, and a general quadrangular shape, such as a rhombic shape, a parallelogram shape, or a trapezoidal shape as well as an oval shape may be adopted without limitation.

The micro-nanofin LED element 107 according to an exemplary embodiment of the present invention may have a length and width of a micro or nano unit. As an example, the element may have a length of 100 nm to 10,000 nm and a width of 100 nm to 3,000 nm. In addition, the element may have a thickness of 100 nm to 3,000 nm. Standards of the length and width may differ according to a shape of a planar surface. As an example, when the planar surface has a rhombic shape or a parallelogram shape, one of two diagonals may be a length, and the other may be a width, and when the planar surface has a trapezoidal shape, the longest of a height, an upper side, and a lower side may be a length, and a shorter one perpendicular to the longest may be a width. Alternatively, when the planar surface has an oval shape, a major axis of the oval shape may be a length, and a minor axis thereof may be a width.

In this case, a ratio of a thickness and a length of the micro-nanofin LED element 100 may be 1:3 or more and more preferably 1:6 or more so that the length may be longer. Therefore, there is an advantage in that the micro-nanofin LED element 100 can be more easily self-aligned on the lower electrode through an electric field. When the ratio of the thickness and the length of the micro-nanofin LED element 100 is less than 1:3 so that the length is decreased, it may be difficult to self-align the element on the electrode through an electric field, and since the element is not fixed onto the lower electrode, there may be a risk of an electrical contact short circuit caused by a process defect. However, the ratio of the thickness and the length may be 1:15 or less, and thus it may be advantageous in achieving the object of the present invention, such as optimization of torque by which the micro-nanofin LED element 100 is self-aligned through an electric field.

In addition, a ratio of a width and a length in the planar surface may also be preferably 1:3 or more and more preferably 1:6 or more so that the length may be longer. Accordingly, there is an advantage in that the micro-nanofin LED element can be more easily self-aligned on the lower electrode through an electric field. However, the ratio of the width and the length may be 1:15 or less, and thus it may be advantageous in optimizing torque by which the micro-nanofin LED element is self-aligned through an electric field.

In addition, a width of the micro-nanofin LED element 107 may be greater than or equal to a thickness, and thus when the micro-nanofin LED element is aligned on the lower electrode line using an electric field, there is an advantage in that the micro-nanofin LED element can be minimized or prevented from lying on its side when aligned. When the micro-nanofin LED element is aligned lying on its side, even if alignment and mounting, in which one end portion and the other end portion thereof are in contact with two adjacent lower electrodes 211/212 or 213/214, are achieved, there is a risk that the element may not emit light due to an electrical short circuit that occurs when an exposed side surface of the photoactive layer in the element comes into contact with an electrode.

In addition, the micro-nanofin LED element 107 may be an element of which both end portions in a length direction thereof have different sizes. As an example, the micro-nanofin LED element 107 may be a rod-type element having a quadrangular planar surface that has an equilateral trapezoidal shape of which a height, that is, a length, is longer than upper and lower sides. As a result, due to a difference in length between the upper side and the lower side, a difference between positive charges and negative charges accumulated at both end portions of the element in a length direction thereof may occur. Therefore, there is an advantage in that self-alignment can be easier through an electric field.

In addition, a protrusion 11 having a certain width and thickness may be formed on a lower surface of the first conductive semiconductor layer 10 of the micro-nanofin LED element 107 in the length direction of the element, or a protrusion may not be formed.

The protrusion 11 will be described in detail in descriptions of a manufacturing method which described below. The protrusion 11 may be formed by etching a wafer in a thickness direction thereof and then horizontally performing etching from both side surfaces of a lower end portion of an etched LED part toward an inner side, that is, a central portion, so as to separate the etched LED part from the wafer. The protrusion 11 may assist in performing a function of improving extraction of top emission of the micro-nanofin LED element.

The protrusion 11 may increase a contact area with the upper electrode line 300 to be formed, and thus it may be advantageous in improving a mechanical coupling force between the upper electrode line 300 and the micro-nanofin LED element 100.

In this case, a width of the protrusion 11 may be formed to be less than or equal to 50% of the width of the micro-nanofin LED element and more preferably less than or equal to 30% thereof, and thus the micro-nanofin LED element etched on an LED wafer may be easily separated. When the protrusion is formed such that the width exceeds 50% of the width of the micro-nanofin LED element, it may not be easy to separate a part of the micro-nanofin LED element etched on the LED wafer, and parts other than a desired part may be separated. Thus, productivity may be reduced, and there may be a risk that the uniformity of a plurality of manufactured micro-nanofin LED elements may be reduced. Meanwhile, the width of the protrusion 11 may be formed to be 10% or more of the width of the micro-nanofin LED element. When the width of the protrusion is formed to be less than 10% of the width of the micro-nanofin LED element, the micro-nanofin LED element may be easily separated from the LED wafer, but during side etching (see FIGS. 18G and 18I) which will be described below, there may be a risk that even a portion of the first conductive semiconductor layer that should not be etched may be etched due to excessive etching, and the above-described effect through the protrusion 11 may not be exhibited. In addition, there may be a risk that the element may be damaged by a wet etching solution, and there may be a problem that the micro-nanofin LED element dispersed in a high-risk etching solution having a strong basic property needs to be cleaned by being separated from the wet etching solution. Meanwhile, a thickness of the protrusion 11 may be in a range of 10% to 30% of a thickness of the first conductive semiconductor layer. Thus, the first conductive semiconductor layer may be formed to have a desired thickness and quality, and it may be more advantageous in exhibiting an effect through the above-described protrusion 11. Here, the thickness of the first conductive semiconductor layer is a thickness based on a lower surface of the first conductive semiconductor layer on which the protrusion is not formed.

As a specific example, the protrusion 11 may have a width of 10 nm to 1,000 nm and a thickness of 10 nm to 1,000 nm.

Hereinafter, each layer included in the micro-nanofin LED element 107 will be described.

The micro-nanofin LED element includes the first conductive semiconductor layer 10 and the second conductive semiconductor layer 30. A conductive semiconductor layer adopted in a typical LED element used for lighting, display, and the like may be used as the used conductive semiconductor layer without limitation. According to an exemplary embodiment of the present invention, any one of the first conductive semiconductor layer 10 and the second conductive semiconductor layer 30 may include at least one n-type semiconductor layer, and the other may include at least one p-type semiconductor layer.

When the first conductive semiconductor layer 10 includes the n-type semiconductor layer, the n-type semiconductor layer may include a semiconductor material having an empirical formula of $In_xAl_yGa_{1-x-y}N$ ($0 \le x \le 1$, $0 \le y \le 1$, and $0 \le x+y \le 1$), for example, at least one selected from among InAlGaN, GaN, AlGaN, InGaN, AlN, and InN. The n-type semiconductor layer may be doped with a first conductive dopant (for example, germanium (Ge), or tin (Sn). According to an exemplary embodiment of the present invention, the first conductive semiconductor layer 10 may have a thickness of 1.5 μm to 5 μm, but the present invention is not limited thereto. The thickness of the first conductive semiconductor layer 10 is preferably greater than or equal to that of the second conductive semiconductor layer 30.

When the second conductive semiconductor layer 30 includes a p-type semiconductor layer, the p-type semiconductor layer may include a semiconductor material having an empirical formula of $In_xAl_yGa_{1-x-y}N$ ($0 \le x \le 1$, $0 \le y \le 1$, and $0 \le x+y \le 1$), for example, at least one selected from among InAlGaN, GaN, AlGaN, InGaN, AlN, and InN. The p-type semiconductor layer may be doped with a second conductive dopant (for example, Mg). According to an exemplary embodiment of the present invention, the second conductive semiconductor layer 30 may have a thickness of 0.01 μm to 0.30 μm, but the present invention is not limited thereto. The thickness of the second conductive semiconductor layer 30 is preferably less than or equal to that of the first conductive semiconductor layer 10.

According to an exemplary embodiment of the present invention, any one of the first conductive semiconductor layer 10 and the second conductive semiconductor layer 30 includes a p-type GaN semiconductor layer, and the other thereof includes an n-type GaN semiconductor layer. The p-type GaN semiconductor layer may have a thickness of 10 nm to 350 nm, and the n-type GaN semiconductor layer may have a thickness of 100 nm to 3,000 nm. Thus, a movement distance of holes injected into the p-type GaN semiconductor layer and electrons injected into the n-type GaN semiconductor layer is shorter as compared with the rod-type element in which the semiconductor layer and the photoactive layer are stacked in the length direction as shown in FIG. 17B. As a result, a probability of electrons and/or holes being captured by defects on a wall during movement is low so that an emission loss can be minimized, and it can also be advantageous in minimizing an emission loss due to an electron-hole velocity imbalance.

Next, the photoactive layer 20 may be formed on the first conductive semiconductor layer 10 and may be formed in a single or multi-quantum well structure. A photoactive layer included in a typical LED element used for lighting, display, and the like may be used as the photoactive layer 20 without limitation. A clad layer (not shown) doped with a conductive dopant may be formed on and/or under the photoactive layer 20 and may be implemented as an AlGaN layer or an InAlGaN layer. In addition, a material such as AlGaN or AlInGaN may be used for the photoactive layer 20. Regarding the photoactive layer 20, when an electric field is applied to the element, electrons and holes move to the photoactive layer from the conductive semiconductor layers positioned on and under the photoactive layer, and electron-hole pairs are generated in the photoactive layer, thereby emitting light. According to an exemplary embodiment of the present invention, the photoactive layer 20 may have a thickness of 30 nm to 300 nm, but the present invention is not limited thereto.

The first conductive semiconductor layer 10, the photoactive layer 20, and the second conductive semiconductor layer may be included as minimal components of the LED element, and another phosphor layer, an active layer, a semiconductor layer, a hole block layer, and/or an electrode layer may be further included on/under each layer.

Meanwhile, according to an exemplary embodiment of the present invention, a protective film 80 formed on the side surface of the micro-nanofin LED element to cover the exposed surface of the photoactive layer 20 may be further included. The protective film 80 is a film for protecting the exposed surface of the photoactive layer 20, and may cover the entirety of the exposed surface of the photoactive layer 20, for example, at least all of both side surfaces and front and rear surfaces of the micro-nanofin LED element. The protective film 80 may preferably include at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN) and may be more preferably made of the above component materials and may be transparent, but the present invention is not limited thereto. According to an exemplary embodiment of the present invention, the protective layer 80 may have a thickness of 5 nm to 200 nm, but the present invention is not limited thereto.

The micro-nanofin LED element 107 may be manufactured through a manufacturing method which will be described below, but the present invention is not limited thereto. Specifically, a micro-nanofin LED element may be manufactured by performing operation A of providing an LED wafer in which a first conductive semiconductor layer, a photoactive layer, and a second conductive semiconductor layer are sequentially stacked on a substrate, operation B of forming a polarization inducing layer patterned on the second conductive semiconductor layer of the LED wafer such that regions having different electrical polarities are adjacent to each other, operation C of etching the LED wafer in a thickness direction thereof such that an individual element has a planar surface with a length and width of a nano or micro size, and a thickness perpendicular to the planar surface is shorter than the length and forming a plurality of micro-nanofin LED pillars, and operation D of separating the plurality of micro-nanofin LED pillars from the substrate.

After operation C is performed and before operation D is performed, a transfer film for manufacturing an ultra-thin LED electrode assembly using a laser-assisted multi-chip transfer printing method may be manufactured by performing an operation of stacking and coupling a donor film on and to the plurality of micro-nanofin LED pillars (or the LED wafer). In this case, the donor film may include a PDMS film, a polyimide film including a dynamic release layer, an elastomeric microstructure stamp film, or a shape memory polymer film.

Figure 18:
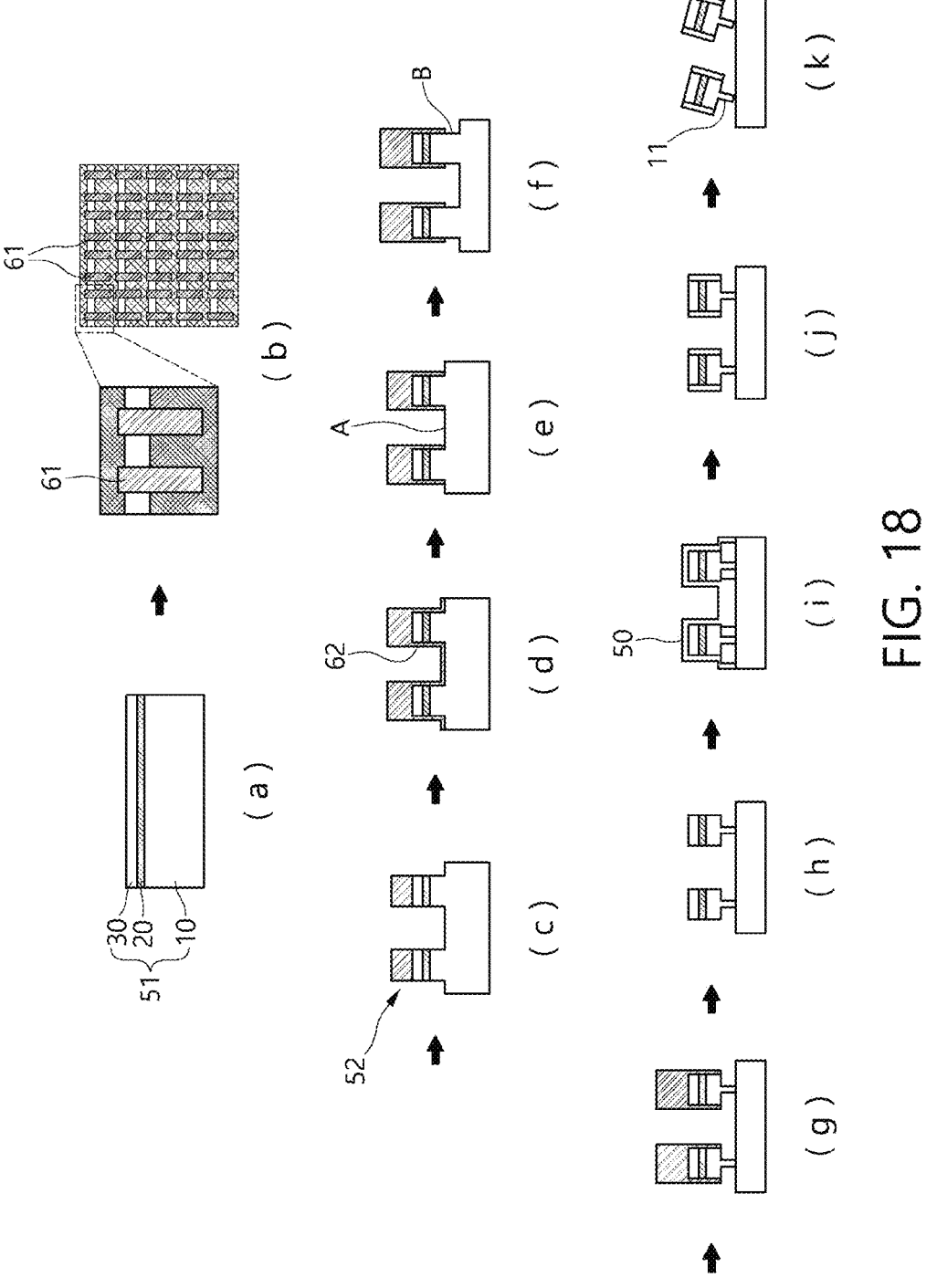
FIG. 18 shows schematic views of a manufacturing process of a micro-nanofin LED element included in an exemplary embodiment of the present invention.

Referring to FIG. 18, first, as operation A of the present invention, an operation of providing an LED wafer 51 in which a first conductive semiconductor layer 10, a photo-active layer 20, and a second conductive semiconductor layer 30 are sequentially stacked on the substrate (not shown) is performed.

Since description of each layer provided in the LED wafer 51 is the same as the above description, detailed description thereof will be omitted, and parts which have not been described will be mainly described.

First, the first conductive semiconductor layer 10 in the LED wafer 51 may be thicker than the first conductive semiconductor layer 10 in the micro-nanofin LED element 100 described above. In addition, each layer in the LED wafer 51 may have a c-plane crystal structure.

The LED wafer 51 may have been subjected to a cleaning process, and since a typical wafer cleaning solution and cleaning process may be appropriately adopted for the cleaning process, the present invention is not particularly limited in that respect. The cleaning solution may be, for example, isopropyl alcohol, acetone, or a hydrochloric acid but is not limited thereto.

Next, as operation B of the present invention, an operation of etching the LED wafer 51 in the thickness direction such that the individual element has the planar surface having a length and width of a nano or micro size, and the thickness perpendicular to the planar surface is shorter than the length and forming a plurality of micro-nanofin LED pillars 52 is performed.

Specifically, operation B may include operation C-1 of forming a mask pattern layer 61 such that the individual element has the planar surface having a certain shape with a length and width of a nano or micro size (see FIG. 18B), operation C-2 of performing etching down to a partial thickness of the first conductive semiconductor layer 10 along a pattern in the thickness direction and forming the plurality of micro-nanofin LED pillars 52 (see FIG. 18C), operation C-3 of forming an insulating film 62 to cover exposed side surfaces of the micro-nanofin LED pillars 52 (see FIG. 18D), operation C4 of removing a portion of the insulating film 62 formed on the first conductive semiconductor layer 10 such that an upper surface A (see FIG. 18E) of the first conductive semiconductor layer 10 between the adjacent micro-nanofin LED pillars 52 is exposed (see FIG. 18E), operation C-5 of further etching the first conductive semiconductor layer 10 in the thickness direction through the exposed upper surface A (see FIG. 18E) of the first conductive semiconductor layer and forming a portion B (see FIG. 18F) of the first conductive semiconductor layer of which a side surface is exposed by as much as a certain thickness in a downward direction of the first conductive semiconductor layer of the micro-nanofin LED pillar on which the insulating film 62 is formed (FIG. 18F), operation C-6 of etching the portion B (see FIG. 18F) of the first conductive semiconductor layer, of which the side surface is exposed, from both side surfaces thereof toward a center thereof (see FIG. 18G), and operation C-7 of removing the insulating film 62 applied on the side surface (see FIG. 18H).

The mask pattern layer 61 may be a layer that is patterned such that an implemented LED element has a desired planar shape and may be formed using a known method and material used for etching an LED wafer. The mask pattern layer 61 may be, for example, a SiO$_2$ hardmask pattern layer. When a method of forming the mask pattern layer 61 will be briefly described, the mask pattern layer 61 may be formed through an operation of forming an unpatterned SiO$_2$ hardmask layer on the LED wafer 51, an operation of forming a metal layer on the SiO$_2$ hardmask layer, an operation of forming a certain pattern on the metal layer, an operation of etching the metal layer and the SiO$_2$ hardmask layer along the pattern, and an operation of removing the metal layer.

The mask layer may be a layer using which the mask pattern layer 61 is formed and may be formed by, for example, depositing SiO$_2$. The mask layer may be formed to have a thickness of 500 nm to 3,000 nm, for example, 1,200 μm. In addition, the metal layer may be, for example, an aluminum layer, and the aluminum layer may be formed through deposition. The certain pattern formed on the formed metal layer may be for implementing a pattern of the mask pattern layer and may be a pattern formed through a typical method. As an example, the pattern may be formed through photolithography using a photosensitive material or may be a pattern formed through a known nanoimprinting method, laser interference lithography, electron beam lithography, or the like. Thereafter, an operation of etching the metal layer and the SiO$_2$ hardmask layer along the formed pattern is performed. As an example, the metal layer may be etched using ICP, and the SiO$_2$ hardmask layer or an imprinted polymer layer may be etched using a dry etching method such as an RIE method.

Next, an operation of removing the metal layer or other photosensitive material layers present on the etched SiO$_2$ hardmask layer or a polymer layer remaining through an imprint method may be performed. The removing may be performed through a typical wet etching or dry etching method according to a material, and detailed descriptions thereof will be omitted in the present invention.

FIG. 18B is a plan view of the SiO$_2$ hardmask pattern layer 61 on the LED wafer 51. After that, as operation C-2, an operation of performing etching down to the partial thickness of the first conductive semiconductor layer 10 along the pattern in the thickness direction and forming the plurality of micro-nanofin LED pillars 52 as shown in FIG. 18C may be performed. The etching may be performed through a typical dry etching method such as an ICP method.

Next, as operation C-3, an operation of forming the insulating film 62 to cover the exposed side surfaces of the micro-nanofin LED pillars 52 as shown in FIG. 18D may be performed. The insulating film 62 applied on the side surface may be formed through deposition, and a material thereof may be, for example, SiO$_2$, but is not limited thereto. The insulating film 62 serves as a side mask layer, and specifically, in a process of etching the portion B of the first conductive semiconductor layer in order to separate the micro-nanofin LED pillars 52 as shown in FIG. 18G, the insulating film 62 performs a function of leaving the side surface of the micro-nanofin LED pillar 52 and preventing damage due to an etching process. The insulating film 62 may have a thickness of 30 nm to 500 nm, but the present invention is not limited thereto.

Next, as operation C4, an operation of removing the portion of removing the insulating film 62 formed on the first conductive semiconductor layer 10 such that the upper surface A (see FIG. 18E) of the first conductive semiconductor layer 10 between the adjacent micro-nanofin LED pillars 52 is exposed as shown in FIG. 18E may be performed. The insulating film 62 may be removed through an appropriate etching method in consideration of a material, and as an example, the insulating film 62 made of SiO$_2$ may be removed through dry etching such as RIE.

Then, as operation C-5, an operation of further etching the first conductive semiconductor layer 10 in the thickness direction through the exposed upper surface A (see FIG. 18E) of the first conductive semiconductor layer and forming the portion B (see FIG. 18F) of the first conductive semiconductor layer of which the side surface is exposed by the certain thickness in the downward direction of the first conductive semiconductor layer of the micro-nanofin LED pillar on which the insulating film 62 is formed as shown in FIG. 18F may be performed. As described above, the exposed portion B of the first conductive semiconductor layer 10 is a portion which is laterally etched in a direction parallel to a base substrate (substrate) in an operation which will be described below. A process of further etching the first conductive semiconductor layer 10 in the thickness direction may be performed through, for example, a dry etching method such as an ICP method.

Next, operation C-6 of laterally etching the portion B (see FIG. 18F) of the first conductive semiconductor layer, of which the side surface is exposed, in the direction parallel to the substrate as shown in FIG. 18G may be performed. The lateral etching may be performed through wet etching. As an example, the wet etching may be performed at a temperature of 60° C. to 100° C. using a tetramethylammonium hydroxide (TMAH) solution.

Thereafter, after wet etching in a lateral direction is performed, as operation C-7, an operation of removing the mask pattern layer 61 disposed on the LED wafer 51 and the insulating film 62 covering the side surface as shown in FIG. 18H may be performed. Both materials of the mask pattern layer 61 disposed on the LED wafer 51 and the insulating film 62 may be SiO$_2$ and may be removed through wet etching. As an example, the wet etching may be performed using a buffer oxide etchant (BOE).

According to an exemplary embodiment of the present invention, between operations C and D described above, as operation E, an operation of forming a protective film 80 on the side surfaces of the plurality of micro-nanofin LED pillars as shown in FIG. 18I may be further performed. The protective film 80 may be formed through, for example, deposition, and may have a thickness of 10 nm to 100 nm, for example, 90 nm, and a material thereof may be, for example, alumina. When alumina used, an ALD method may be used as an example of the deposition. In addition, in order for the deposited protective film 80 to be formed only on the side surfaces of the plurality of micro-nanofin LED pillars, the protective film 80 positioned on the portions other than the side surfaces may be removed through an etching method, for example, a dry etching method using ICP. Meanwhile, although the protective film 80 is illustrated in FIG. 18J as surrounding the entire side surface, the protective film 80 may not be formed on the entirety or a portion of the portions of the side surface other than the photoactive layer.

Next, as operation D, an operation of separating the plurality of micro-nanofin LED pillars from the substrate as shown in FIG. 18K is performed. The separating may be performed through cutting using a cutting mechanism or detachment using an adhesive film, and the present invention is not particularly limited thereto.

As described above, although not shown in the drawing, before operation D is performed, a donor film may be stacked on and coupled to the plurality of micro-nanofin LED pillars in FIG. 18I, and then operation D may be performed to manufacture a transfer film for laser-assisted multi-chip transfer printing.

In addition, in the above-described manufacturing method of the second type (micro-nanofin) ultra-thin LED element, in the separating in operation D, as in manufacturing of the first (dot or disc) type ultra-thin LED electrode element, the plurality of micro-nanofin LED pillars 52 may also be obtained from the substrate by performing an operation of immersing the LED wafer in an electrolyte to then electrically connect the LED wafer to any one terminal of a power supply and electrically connect the other terminal of the power supply to an electrode immersed in the electrolyte, and then applying power to form a plurality of pores in a first portion, and an operation of applying ultrasonic waves to the LED wafer to separate a plurality of LED structures from the first portion in which the plurality of pores are formed.

Pores may be formed in a portion of the first conductive semiconductor layer (or an n-type conductive semiconductor layer) of each of the plurality of micro-nanofin LED pillars.

Meanwhile, as shown in FIG. 13, in the micro-nanofin LED element 107, one surface of the element positioned at a side of a second conductive semiconductor layer 30 among surfaces in a thickness direction thereof in which each layer is stacked may be in contact with two adjacent electrodes 211/212 or 213/214 of a lower electrode line 200, and the first conductive semiconductor layer 10, which is opposite to the one surface of the element, may be in contact with an upper electrode line 300. In this case, due to a protrusion formed on one surface of the first conductive semiconductor layer 10, the one surface of the element may be disposed in contact with the lower electrode line 200 with a higher probability.

In addition, in the lower electrode line 200, a unit electrode area, that is, an area of a region that can be driven independently when the micro-nanofin LED element is arranged on the lower electrode line 200, and then the upper electrode line 300 is disposed on the micro-nanofin LED element, may be preferably in a range of 1 $\mu m^2$ to 100 cm$^2$ and more preferably in a range of 4 $\mu m^2$ to 100 mm$^2$, but the unit electrode area is not limited to the above area.

According to an exemplary embodiment of the present invention, as shown in FIG. 13, in order to reduce contact resistance between the micro-nanofin LED elements 107 disposed on the lower electrode line 200, a conducting metal layer 500 may be further included to connect the lower electrode line 200 and the second conductive semiconductor layer 30 of the micro-nanofin LED element 107 in contact with the lower electrode line 200. The conducting metal layer 500 may be a conductive metal layer of silver, aluminum, or gold and may be formed to have a thickness of, for example, about 10 nm.

In addition, an insulating layer 600 may be further included in a space between the lower electrode line 200 and the upper electrode line 300 in electrical contact with the first conductive semiconductor layer 10 corresponding to an upper surface of the self-aligned micro-nanofin LED element 107. The insulating layer 600 prevents electrical contact between the two electrode lines 200 and 300 which vertically face each other and performs a function of more easily implementing the upper electrode line 300.

For the insulating layer 600, a material performing a typical insulating function may be used without limitation. Preferably, the insulating layer 600 may be made of a transparent material. As an example, the insulating layer 600 may be a layer made of an insulating material such as SiO$_2$, SiN$_x$, Al$_2$O, HfO$_2$, or ZrO$_2$.

A line on which a conducting metal layer is to be deposited may be patterned by applying a photolithography process using a photosensitive material to then deposit the conducting metal layer, or a deposited metal layer may be patterned and then etched, thereby manufacturing the conducting metal layer 500. Such a process may be performed by appropriately adopting a known method, and Korean Patent Application No. 10-2016-41181910 by the inventor of the present invention may be incorporated by reference.

After the conducting metal layer 500 is formed, an operation of forming the insulating layer 600 on the lower electrode line 200 to not cover the upper surface of the self-aligned micro-nanofin LED element 107 may be performed. The insulating layer 600 may be formed by depositing a known insulating material. As an example, an insulating material such as $SiO_2$ or $SiN_x$ may be deposited through a PECVD method, an insulating material such as AlN or GaN may be deposited through a MOCVD method, or an insulating material such as $Al_2O$, $HfO_2$, or $ZrO_2$ may be deposited through an ALD method. Meanwhile, the insulating layer 600 may be formed at a level to not cover the upper surface of the self-aligned micro-nanofin LED element 107, and to this end, the insulating layer may be formed through deposition to a thickness to not cover the upper surface, or after the insulating layer is deposited to cover the upper surface, dry etching may be performed before upper surface of the element is exposed.

The present invention will be described in more detail through the following examples, however, the following examples do not limit the scope of the present invention, and it should be understood that the following examples are intended to facilitate understanding of the present invention.

EXAMPLES

Example 1: Manufacturing of First Type Ultra-Thin LED Element

A typical LED wafer (manufactured by EPISTAR Corporation), in which an undoped n-type III-nitride semiconductor layer, an n-type III-nitride semiconductor layer doped with Si (with a thickness of 4 μm), a photoactive layer (with a thickness of 0.45 μm), and a p-type III-nitride semiconductor layer (with a thickness of 0.05 μm) were sequentially stacked on a substrate, was provided.

On the provided LED wafer, ITO (with a thickness of 0.15 μm) as a lower electrode layer, $SiO_2$ (with a thickness of 1.2 μm) as a first mask layer, and Al (with a thickness of 0.2 μm) as a second mask layer were sequentially deposited, and then a spin-on glass (SOG) resin layer onto which a pattern was transferred was transferred onto the second mask layer using a nanoimprint apparatus.

Thereafter, the SOG resin layer was cured using RIE, and a residual resin portion of the resin layer was etched through RIE to form a resin pattern layer. After that, the second mask layer was etched along a pattern using ICP, and the first mask layer was etched using RIE. Next, after the lower electrode layer, the p-type III-nitride semiconductor layer, and the photoactive layer were etched using ICP, the doped n-type III-nitride semiconductor layer was etched to a thickness of 0.78 μm to manufacture an LED wafer on which a plurality of LED structures (with a diameter of 850 nm and a height of 850 nm) were formed through KOH wet etching in order to implement a side surface of the etched doped n-type III-nitride semiconductor layer to be perpendicular to a layer surface.

Figures 19A, 19B, 19C, 20A, 20B, 20C:
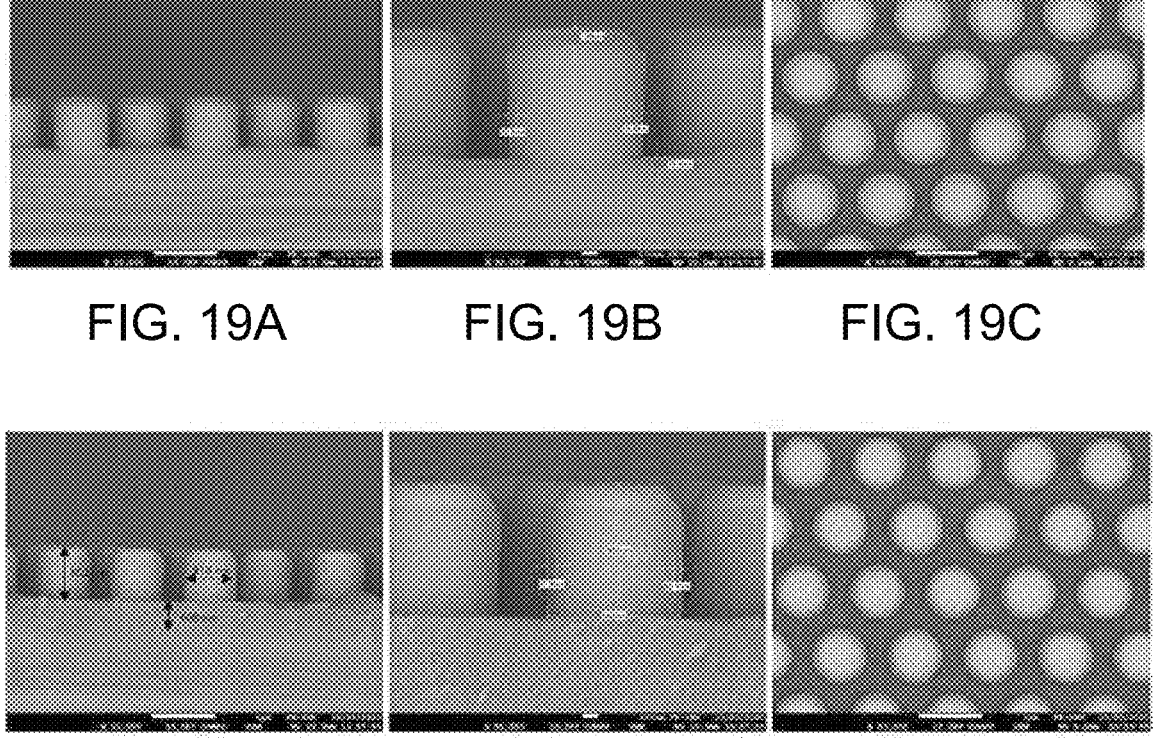
FIG. 19A, FIG. 19B, and FIG. 19C and FIG. 20A, FIG. 20B, and FIG. 20C show scanning electron microscope (SEM) images at a specific operation of a manufacturing method of an ultra-thin LED element (first type) used in an exemplary embodiment of the present invention. Here.

Thereafter, a protective film material of $SiN_x$ was deposited on the LED wafer on which the plurality of LED structures were formed (to deposition thicknesses of 52.5 nm and 72.5 nm based on a side surface of the LED structure, see a scanning electron microscope (SEM) images of FIG. 19A-FIG. 19C), and then the protective film material formed between the plurality of LED structures was removed through a reactive ion etcher to expose an upper surface $S_1$ of a first portion a of the doped n-type III-nitride semiconductor layer.

After that, the LED wafer on which a temporary protective film was formed was immersed in an electrolyte solution of 0.3 M of oxalic acid and then connected to an anode terminal of a power supply, a cathode terminal was connected to a platinum electrode immersed in the electrolyte, and then a voltage of 10 V was applied for 5 minutes to form a plurality of pores from the surface of the first portion a of the doped n-type III-nitride semiconductor layer to a point at a depth of 600 nm as shown in a SEM images of FIG. 20A-FIG. 20C. Next, after the temporary protective film was removed through RIE, a surface protective film made of $Al_2O_3$ was deposited again on the LED wafer to a thickness of 50 nm based on the side surface of the LED structure, and the surface protective film formed on the plurality of LED structures and the surface protective film formed on the surface $S_1$ of the first portion a of the doped n-type III-nitride semiconductor layer were removed through ICP to expose the upper surface $S_1$ of the first portion a of the doped n-type III-nitride semiconductor layer and an upper surface of the LED structure.

Then, after a Ti/Au layer (with a thickness of 10 nm/100 nm) was further formed as an electrode layer on the lower electrode layer, 1,2-ethanedithiol was processed on the Ti/Au layer to form a bonding layer at which a thiol group was exposed.

Thereafter, a PDMS stamp film (donor film) was stacked on an upper surface of the LED structure to bond the LED structure with the PDMS stamp film.

Then, after the LED wafer was immersed in a bubble-forming solution of gamma-butyllactone, by using bubbles generated by radiating ultrasonic waves at a frequency of 40 kHz for 10 minutes, the pores formed in the doped n-type III-nitride semiconductor layer were collapsed to separate the plurality of LED wafers, thereby manufacturing a transfer film in which a plurality of ultra-thin LED elements were vertically arranged on the donor film.

Comparative Example 1: Rod-Type LED Element

A rod-type LED element assembly having a diameter of 650 nm and a height of 4.2 μm and the same stacked structure as in Example 1 was manufactured from an LED wafer through a typical method.

Manufacturing Example 1: Manufacturing of Ultra-Thin LED Electrode Assembly Through Laser-Assisted Multi-Chip Transfer Printing A lower electrode in which a plurality of lower electrode lines were formed was provided on a flexible substrate.

Through laser assisted multi-chip transfer printing, the ultra-thin LED elements of the transfer film of Example 1 were transferred onto the lower electrode to form a plurality of subpixel units and a plurality of pixel units.

In this case, the laser-assisted multi-chip transfer printing was performed in a such a manner that, by radiating a laser onto a mask in which a plurality of openings are formed, the ultra-thin LED elements were separated from the donor film of the transfer film and transferred onto the lower electrode.

One pixel unit included three subpixel units, and the three subpixel units included a first subpixel unit including an ultra-thin blue LED element, a second subpixel unit including an ultra-thin green LED element, and a third subpixel unit including an ultra-thin red LED element.

Each of the three subpixel units included six ultra-thin LED elements, and each of the ultra-thin LED elements were erected and formed on the lower electrode.

In this case, the ultra-thin LED element had a diameter of 750 nm and a height of 1.1 μm.

Then, after $SiO_2$ as an insulating layer serving as an insulator was formed to a thickness of 1.4 μm to 1.6 μm, the insulating layer formed to a corresponding thickness was etched to expose n-GaN of the ultra-thin LED element by a thickness of 300 nm to 400 nm, and then aluminum zinc oxide (AZO) or ITO used as a transparent electrode was deposited to a thickness of 150 nm on the exposed ultra-thin LED element to form an upper electrode line including an upper electrode on the ultra-thin LED element, thereby manufacturing an ultra-thin LED electrode assembly having a width of 0.3 mm and a length of 0.3 mm.

Experimental Example 1

Power was applied to the upper electrode line and the lower electrode line of the ultra-thin LED electrode assembly provided in Example 1, an ultra-thin LED electrode assembly emitting light and having 1,000 PPI was manufactured, and it was confirmed that dark spots in the pixel did not occur.

In an ultra-thin LED electrode assembly of the present invention, by using a laser-assisted multi-chip transfer printing method, a plurality of ultra-thin LED element can be simultaneously formed into one subpixel unit or a pixel unit, thereby considerably reducing defects due to occurrence of dark spots in a display caused by vacancies and misalignment of LED elements and providing a high-resolution ultra-thin LED display with a reduced thickness, high efficiency, high brightness, and high stability as compared with an existing LED display. In addition, in an ultra-thin LED element used in an ultra-thin LED electrode assembly of the present invention, a light emitting area of an element can be considerably increased, and an area of a photoactive layer exposed at a surface can also be considerably reduced to prevent or minimize a decrease in efficiency due to surface defects, thereby implementing a high quality electrode assembly, minimizing a decrease in electron-hole recombination efficiency due to non-uniformity of electron and hole velocities of a used LED element and a decrease in luminous efficiency due to the decrease in electron-hole recombination efficiency, and more easily implementing an LED electrode assembly.

Although exemplary embodiments of the present invention have been disclosed, it will be apparent that various changes, modifications, and equivalents may be made thereto and the exemplary embodiment may be adequately modified and applied in the same manner. Therefore, the foregoing description in no way limits the scope of the present invention, which shall be defined by the claims appended hereto.

What is claimed is:

1. A manufacturing method of an ultra-thin light-emitting diode (LED) electrode assembly, comprising performing a process which includes:

operation 1 of preparing a plurality of lower electrodes on a substrate; and

46 operation 2 of forming a plurality of pixel units on the lower electrodes, wherein:

in operation 2, each of the plurality of pixel units includes a plurality of ultra-thin LED elements; and the ultra-thin LED element is formed by being transferred through a laser-assisted multi-chip transfer printing method, wherein the ultra-thin LED element includes at least one selected from:

a dot or disc LED element which has a thickness of 3,000 nm or less in a stacking direction of layers, wherein the dot LED element has a ratio between the thickness and a length of a major axis in a cross section perpendicular to the stacking direction in a range of 1:0.5 to 1:1.5, and the disc LED element has a ratio between the thickness and a length of a major axis in a cross section perpendicular to the stacking direction in a range of 1:1.5 to 1:5.0; and a micro-nanofin LED element which has a thickness of 100 nm to 3,000 nm in a stacking direction of layers and in which a length of a major axis in a cross section perpendicular to the stacking direction is in a range of 100 nm to 10,000 nm, and a ratio between the thickness and the length of the major axis is 1:3 or more.

2. The manufacturing method of claim 1, wherein:

in operation 2, a laser is radiated onto one surface of a transfer film through openings of a mask to transfer the ultra-thin LED elements onto the lower electrodes to form the pixel unit including the plurality of ultra-thin LED elements on the lower electrodes;

the transfer film includes a donor film and the plurality of ultra-thin LED elements arranged on the donor film; and the laser is radiated from below the donor film.

3. The manufacturing method of claim 2, wherein:

each of the plurality of ultra-thin LED elements includes a second conductive semiconductor layer, a photoactive layer, and a first conductive semiconductor layer which are stacked; and the ultra-thin LED element is erected and disposed such that the second conductive semiconductor layer of the ultra-thin LED element faces the donor film.

4. The manufacturing method of claim 1, wherein:

each of the plurality of ultra-thin LED elements includes a first conductive semiconductor layer, a photoactive layer, and a second conductive semiconductor layer which are stacked; and the ultra-thin LED element is erected and disposed such that the first conductive semiconductor layer of the ultra-thin LED element faces the lower electrode.

5. The manufacturing method of claim 2, wherein the donor film includes a polydimethylsiloxane stamp (PDMS) film, a polyimide film including a dynamic release layer, an elastomeric microstructure stamp film, or a shape memory polymer film.

6. The manufacturing method of claim 2, wherein:

in the transfer of operation 2, the plurality of openings are formed in the mask; and the laser is radiated through each of the plurality of openings to simultaneously transfer three or more ultra-thin LED elements per opening onto the lower electrodes.

7. The manufacturing method of claim 6, wherein:

the plurality of ultra-thin LED elements simultaneously transferred onto the lower electrodes through the laser radiated through the same opening of the mask form one pixel unit or form three or four subpixel units; and the three or four subpixel units form one pixel unit.

8. The manufacturing method of claim 1, wherein the ultra-thin LED element includes at least one selected from among an ultra-thin blue LED element, an ultra-thin green LED element, and an ultra-thin red LED element.

9. The manufacturing method of claim 1, wherein the process further includes:

operation 3 of filling a periphery of the ultra-thin LED element with an insulator to form an insulating layer; and operation 4 of forming upper electrodes to be electrically connected to an opposite side of the ultra-thin LED element opposite to one side of the ultra-thin LED element assembled on the lower electrodes.

10. A transfer film of an ultra-thin light-emitting diode (LED) for manufacturing an LED electrode assembly using a laser-assisted multi-chip transfer printing method, the transfer film comprising:

a donor film; and a plurality of ultra-thin LED elements arranged on the donor film, wherein:

each of the plurality of ultra-thin LED elements includes a second conductive semiconductor layer, a photoactive layer, and a first conductive semiconductor layer which are stacked; and the ultra-thin LED element is erected and disposed such that the second conductive semiconductor layer of the ultra-thin LED element faces the donor film, wherein the ultra-thin LED element includes at least one selected from:

a disc or dot LED element which has a thickness of 3,000 nm or less in a stacking direction of layers, wherein the dot LED element has a ratio between the thickness and a length of a major axis in a cross section perpendicular to the stacking direction in a range of 1:0.5 to 1:1.5, and the disc LED element has a ratio between the thickness and a length of a major axis in a cross section perpendicular to the stacking direction in a range of 1:1.5 to 1:5.0; and a micro-nanofin LED element which has a thickness of 100 nm to 3,000 nm in a stacking direction of layers and in which a length of a major axis in a vertical cross section is in a range of 100 nm to 10,000 nm, and a ratio between the thickness and the length of the major axis is 1:3 or more.

11. The transfer film of claim 10, wherein the ultra-thin LED element includes at least one selected from among an ultra-thin blue LED element, an ultra-thin green LED element, and an ultra-thin red LED element.

12. The transfer film of claim 10, wherein:

the ultra-thin LED element further includes an arrangement guide layer, which is for erecting and arranging the ultra-thin LED element in a thickness direction thereof, at one side of the ultra-thin LED element in the thickness direction and one side or both sides of a region on a lower electrode in which the ultra-thin LED element is to be disposed; and the arrangement guide layer is a magnetic layer, a charge layer, or a bonding layer.

13. The transfer film of claim 10, wherein:

the first conductive semiconductor layer of the ultra-thin LED element is an n-type III-nitride semiconductor layer; and the ultra-thin LED element further includes an electron delay layer on an opposite surface opposite to one surface of the first conductive semiconductor layer adjacent to the photoactive layer such that the numbers of electrons and holes recombined in the photoactive layer are balanced.

14. The transfer film of claim 13, wherein:

the first conductive semiconductor layer is a doped n-type III-nitride semiconductor layer; and the electron delay layer is a III-nitride semiconductor having a lower doping concentration than the first conductive semiconductor layer.

15. The transfer film of claim 10, wherein:

the second conductive semiconductor layer of the ultra-thin LED element is a p-type III-nitride semiconductor layer; and the ultra-thin LED element further includes an electron delay layer on an opposite surface opposite to one surface of the second conductive semiconductor layer adjacent to the photoactive layer such that the numbers of electrons and holes recombined in the photoactive layer are balanced.

16. The transfer film of claim 10, wherein:

the first conductive semiconductor layer of the ultra-thin LED element is an n-type III-nitride semiconductor layer;

the second conductive semiconductor layer is a p-type III-nitride semiconductor layer;

the ultra-thin LED element further includes at least one film of a hole pushing film which surrounds an exposed side surface of the second conductive semiconductor layer or the exposed side surface of the second conductive semiconductor layer and an exposed side surface of at least a portion of the photoactive layer to move holes at a side of the exposed side surface toward a center and an electron pushing film which surrounds an exposed side surface of the first conductive semiconductor layer to move electrons at a side of the exposed side surface side toward a center;

the ultra-thin LED element includes both the hole pushing film and the electron pushing film; and the electron pushing film is provided as an outermost film surrounding the side surfaces of the first conductive semiconductor layer, the photoactive layer, and the second conductive semiconductor layer.

17. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 10.

18. A high-resolution ultra-thin light-emitting diode (LED) display comprising the ultra-thin LED electrode assembly of claim 17.

19. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 12.

20. A high-resolution ultra-thin light-emitting diode (LED) display comprising the ultra-thin LED electrode assembly of claim 19.

21. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 13.

22. A high-resolution ultra-thin light-emitting diode (LED) display comprising the ultra-thin LED electrode assembly of claim 21.

23. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 14.

24. A high-resolution ultra-thin light-emitting diode (LED) display comprising the ultra-thin LED electrode assembly of claim 23.

25. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 15.

26. A high-resolution ultra-thin light-emitting diode (LED) display comprising the ultra-thin LED electrode assembly of claim 25.

27. An ultra-thin light-emitting diode (LED) electrode assembly comprising:

a plurality of lower electrodes formed on a substrate;

a plurality of pixel units formed on the lower electrodes;

an insulating layer formed on the substrate and the plurality of pixel units; and a plurality of upper electrodes formed on the insulating layer, wherein each of the plurality of pixel units includes subpixel units each including a plurality of ultra-thin LED elements formed using the transfer film of the ultra-thin LED of claim 16.

28. A high-resolution ultra-thin light-emitting diode (LED) display comprising the ultra-thin LED electrode assembly of claim 27.

* * * * *